(12) United States Patent
Tanaka et al.

(10) Patent No.: US 10,367,056 B2
(45) Date of Patent: Jul. 30, 2019

(54) SEMICONDUCTOR DEVICE

(71) Applicant: FUJI ELECTRIC CO., LTD., Kawasaki-shi, Kanagawa (JP)

(72) Inventors: Takahide Tanaka, Matsumoto (JP); Masaharu Yamaji, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/799,477

(22) Filed: Oct. 31, 2017

(65) Prior Publication Data

US 2018/0069076 A1    Mar. 8, 2018

Related U.S. Application Data

(63) Continuation of application No. PCT/JP2016/080688, filed on Oct. 17, 2016.

(30) Foreign Application Priority Data

Nov. 19, 2015  (JP) .................................. 2015-226757

(51) Int. Cl.
*H01L 29/06* (2006.01)
*H01L 27/092* (2006.01)
(Continued)

(52) U.S. Cl.
CPC .......... *H01L 29/063* (2013.01); *H01L 21/761* (2013.01); *H01L 27/092* (2013.01);
(Continued)

(58) Field of Classification Search
CPC ....... H01L 29/0692–0696; H01L 29/402–407; H01L 29/0638–0646; H01L 27/06;
(Continued)

(56) References Cited

U.S. PATENT DOCUMENTS

| 5,894,156 A | 4/1999 | Terashima et al. |
| 2007/0085595 A1* | 4/2007 | Taki ...................... H01L 27/092 327/534 |

(Continued)

FOREIGN PATENT DOCUMENTS

| JP | H09-283716 A | 10/1997 |
| JP | 2005-123512 A | 5/2005 |

(Continued)

*Primary Examiner* — Eric A. Ward
*Assistant Examiner* — Eric K Ashbahian
(74) *Attorney, Agent, or Firm* — Rabin & Berdo, P.C.

(57) ABSTRACT

An HVJT is includes a parasitic diode formed by pn junction between an $n^-$-type diffusion region and a second $p^-$-type separation region surrounding a periphery thereof. The $n^-$-type diffusion region is arranged between an n-type diffusion region that is a high potential side region and an n-type diffusion region that is a low potential side region, and electrically separates these regions. In the $n^-$-type diffusion region, an nchMOSFET of a level-up level shift circuit is arranged. The $n^-$-type diffusion region has a planar layout in which the $n^-$-type diffusion region surrounds a periphery of the n-type diffusion region and a region where the nchMOSFET is arranged protrudes inwardly. A high-concentration inter-region distance L1 of the nchMOS region where the nchMOSFET is arranged is longer than a high-concentration inter-region distance L2 of the parasitic diode. Thus, the reliability of the semiconductor device may be improved.

15 Claims, 26 Drawing Sheets

(51) Int. Cl.
*H01L 29/78* (2006.01)
*H03K 19/0185* (2006.01)
*H01L 21/761* (2006.01)
*H01L 29/10* (2006.01)
*H01L 21/8238* (2006.01)
*H01L 29/423* (2006.01)
*H01L 29/08* (2006.01)

(52) U.S. Cl.
CPC ...... *H01L 27/0922* (2013.01); *H01L 29/0634* (2013.01); *H01L 29/0692* (2013.01); *H01L 29/0696* (2013.01); *H01L 29/7816* (2013.01); *H01L 29/7818* (2013.01); *H01L 29/7835* (2013.01); *H03K 19/018521* (2013.01); *H01L 21/823878* (2013.01); *H01L 21/823892* (2013.01); *H01L 29/086* (2013.01); *H01L 29/1095* (2013.01); *H01L 29/42368* (2013.01)

(58) Field of Classification Search
CPC . H01L 27/088; H01L 27/092; H01L 21/8234; H01L 29/063–0638
See application file for complete search history.

(56) References Cited

U.S. PATENT DOCUMENTS

| | | | |
|---|---|---|---|
| 2010/0148823 A1* | 6/2010 | Shimizu | H01L 27/0629 326/102 |
| 2012/0267750 A1 | 10/2012 | Imai et al. | |
| 2014/0191281 A1* | 7/2014 | Yamaji | H01L 27/088 257/139 |
| 2014/0264583 A1* | 9/2014 | Yamaji | H01L 27/088 257/339 |
| 2014/0346633 A1 | 11/2014 | Jonishi et al. | |
| 2015/0014783 A1 | 1/2015 | Imai et al. | |
| 2015/0236013 A1 | 8/2015 | Yamaji | |
| 2015/0255454 A1 | 9/2015 | Jonishi | |
| 2016/0329425 A1 | 11/2016 | Ichikawa | |

FOREIGN PATENT DOCUMENTS

| | | |
|---|---|---|
| JP | 2012-227300 A | 11/2012 |
| JP | 2015-170733 A | 9/2015 |
| JP | 2015-173255 A | 10/2015 |
| WO | WO-2013/179784 A1 | 12/2013 |
| WO | WO-2014/041921 A1 | 3/2014 |

* cited by examiner

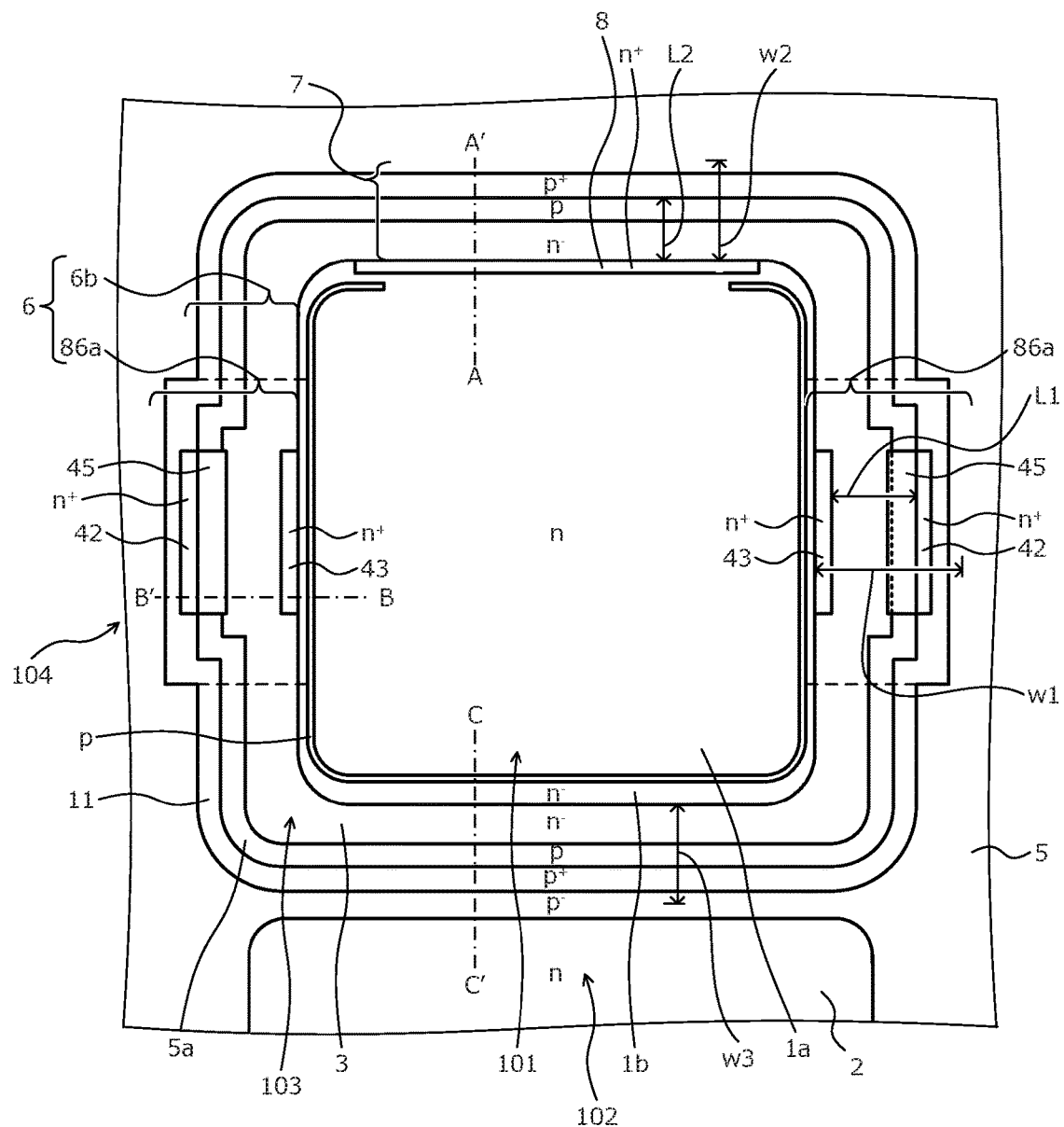

FIG.15

SEMICONDUCTOR DEVICE

CROSS REFERENCE TO RELATED APPLICATIONS

This is a continuation application of International Application PCT/JP2016/080688 filed on Oct. 17, 2016 which claims priority from a Japanese Patent Application No. 2015-226757 filed on Nov. 19, 2015, the contents of which are incorporated herein by reference.

BACKGROUND OF THE INVENTION

1. Field of the Invention

Embodiments of the present invention relate to a semiconductor device.

2. Description of the Related Art

A conventionally known element separation method for a high voltage integrated circuit (HVIC) utilizes a high voltage junction in which a high potential side region and a low potential side region provided on a single semiconductor chip are electrically separated by a high-voltage junction termination region (HVJT) provided between the regions. It is known that a high-voltage n-channel Metal Oxide Semiconductor Field Effect Transistor (MOSFET: insulated gate field effect transistor) or a p-channel MOSFET functioning as a level shifter is arranged in the HVJT to transmit signals between a high potential region and a low potential region via the level shifter (see, e.g., Japanese Laid-Open Patent Publication Nos. H9-283716 and 2005-123512). Configurations of an HVJT and a level shifter of a conventional semiconductor device will be described.

FIGS. 20, 21, 22, 23, and 24 are plan views of examples of planar layouts of main parts of conventional semiconductor devices. FIGS. 20 and 21 are FIGS. 1 and 8, respectively, of Japanese Laid-Open Patent Publication No. H9-283716, and FIG. 24 is FIG. 6 of Japanese Laid-Open Patent Publication No. 2005-123512. The conventional semiconductor device depicted in FIG. 20 has a configuration including a high potential side region 211 and a low potential side region 212 on a single p$^-$-type semiconductor substrate 201 with an HVJT 213 electrically separating the regions from each other. The high potential side region 211 is an n-type region 202 provided in the p$^-$-type semiconductor substrate 201. The HVJT 213 is an n$^-$-type region 203 surrounding a periphery of the n-type region 202. The low potential side region 212 is a portion of the p$^-$-type semiconductor substrate 201 on the outer side than the n$^-$-type region 203. In the n-type region 202 and the n$^-$-type region 203, a portion (hereinafter referred to as a p$^-$-type separation region) 204 of the p$^-$-type semiconductor substrate 201 is interposed in a substantially U-shaped planar layout extending from the low potential side region 212 through the HVJT 213 and the high potential side region 211 and returning to the low potential side region 212.

The p$^-$-type separation region 204 electrically separates portions 202a, 203a of continuous portions of the n-type region 202 and the n$^-$-type region 203 from the other potions. An n-channel MOSFET used as a level shifter 214 is arranged in the portions 202a, 203a surrounded by the p$^-$-type separation region 204. In the conventional semiconductor device depicted in FIG. 21, a p$^-$-type separation region 205 arranged in a substantially rectangular frame-shaped planar layout in the n-type region 202 separates a portion (hereinafter referred to as a peripheral edge portion) 202b outside the n-type region 202 and a portion (hereinafter referred to as a central portion) inside the n-type region 202.

An n-channel MOSFET used as the level shifter 214 is arranged continuously in the peripheral edge portion 202b of the n-type region 202 and the n$^-$-type region 203. The arrangement of the high potential side region 211, the low potential side region 212, and the HVJT 213 of the conventional semiconductor device depicted in FIG. 21 is similar to that of the conventional semiconductor device depicted in FIG. 20 (similarly in FIGS. 22 to 24).

In the conventional semiconductor device depicted in FIG. 22, a p$^-$-type separation region 206 arranged in a substantially C-shaped planar layout in the n-type region 202 separates a portion 202c extending along three sides of a peripheral edge portion of the n-type region 202 arranged in a rectangular planar layout and a central portion of the n-type region 202. An n-channel MOSFET used as the level shifter 214 is arranged continuously in the portion 202c extending along the three sides separated by the p$^-$-type separation region 206 in the peripheral edge portion of the n-type region 202 and the n$^-$-type region 203. A portion 202d extending along one side not separated by the p$^-$-type separation region 206 in the peripheral edge portion of the n-type region 202 is fixed at the highest potential of the high potential side region 211. A resistance used as a level shift resistor is that of a diffusion region between the portion 202d fixed at the highest potential of the high potential side region 211 in the peripheral edge portion of the n-type region 202 and a drain region (not depicted) of the n-channel MOSFET constituting the level shifter 214.

The conventional semiconductor device depicted in FIG. 23 has a configuration in which a double Reduced Surface Field (RESURF) structure is applied to the HVJT 213 of the conventional semiconductor device depicted in FIG. 22. The double RESURF structure is made up of p-type regions 209a, 209b arranged in n$^-$-type region 203. A p-channel MOSFET 214b used as the level shifter 214 is arranged continuously in the portion 202d fixed at the highest potential of the high potential side region 211 in the peripheral edge portion of the n-type region 202 and the n$^-$-type region 203. The HVJT 213 and the low potential side region 212 are separated by a p$^-$-type separation region 208. Reference numerals 221 to 224 denote a p-type base region, an n$^+$-type source region, an n$^+$-type drain region, and a gate electrode, respectively, of an n-channel MOSFET 214a constituting the level shifter 214. Reference numerals 225 to 227 denote a p$^+$-type source region, a p$^+$-type drain region, and a gate electrode, respectively, of the p-channel MOSFET 214b. An n$^+$-type region 228 and a p$^+$-type region 229 also serve as a cathode contact region and an anode contact region, respectively, of a parasitic diode of the HVJT 213.

In the conventional semiconductor device depicted in FIG. 24, a portion of the HVJT 213 is separated (e.g., at two positions) by a trench 207, and an n-channel MOSFET and a p-channel MOSFET used as the level shifters 214 (214a, 214b) are arranged in respective regions surrounded by the trench 207. Reference numerals 215, 216 are wires. As described above, in the configurations in which a portion of the HVJT 213 is used as the level shifter 214 depicted in FIGS. 20 to 24, the p$^-$-type separation regions 204 to 206 or the trench 207 electrically separate a region of the high potential side region 211 in which an internal circuit is arranged and a region of the HVJT 213 in which at least the n-channel MOSFET used as the level shifter 214 is arranged. Additionally, the configurations need no high potential wiring passing over the HVJT 213 from the low potential side region 212 to the high potential side region 211 and therefore, are highly reliable. As compared to a configuration in which the level shifter 214 is arranged in a region other than the HVJT 213, the chip size can be reduced (shrunk) by the occupied area of the level shifter 214.

SUMMARY OF THE INVENTION

According to one embodiment of the present invention, a semiconductor device includes a first semiconductor region of a second conductivity type selectively provided on a semiconductor substrate of a first conductivity-type; a second semiconductor region of the second conductivity type surrounding a periphery of the first semiconductor region; a third semiconductor region of the first conductivity type surrounding a periphery of the second semiconductor region; a fourth semiconductor region of the second conductivity type selectively provided in the third semiconductor region; a fifth semiconductor region of the second conductivity type selectively provided in one of the first semiconductor region and the second semiconductor region, an impurity concentration of the fifth semiconductor region being higher than that of the second semiconductor region; a first gate electrode provided on a surface of a portion of the third semiconductor region between the fourth semiconductor region and the second semiconductor region, the first gate electrode provided via a first gate insulating film; a first electrode contacting the third semiconductor region and the fourth semiconductor region; a second electrode contacting the fifth semiconductor region; a sixth semiconductor region of the second conductivity type selectively provided in one of the first semiconductor region and the second semiconductor region, separate from the fifth semiconductor region, an impurity concentration of the sixth semiconductor region being higher than that of the second semiconductor region; a seventh semiconductor region of the first conductivity type selectively provided in the third semiconductor region, an impurity concentration of the seventh semiconductor region being higher than that of the third semiconductor region; the first electrode contacting the seventh semiconductor region; and a third electrode contacting the sixth semiconductor region. A distance between the fourth semiconductor region and the fifth semiconductor region is longer than a distance between the seventh semiconductor region and the sixth semiconductor region.

In one embodiment, the semiconductor device further includes an eighth semiconductor region of the first conductivity type provided at least on an inner side of the fifth semiconductor region. The second semiconductor region is arranged to have a protruding part that protrudes either inwardly toward a center of the first semiconductor region or outwardly away from the center of the first semiconductor region in a planar layout, or that protrudes both inwardly and outwardly in the planar layout. The fifth semiconductor region is arranged in an inward portion of the protruding part of the second semiconductor region, and the fourth semiconductor region is arranged at a position facing an outer side of the fifth semiconductor region.

In one embodiment, the second semiconductor region is arranged in a planar layout in which the protruding part protrudes inwardly, toward the center of the first semiconductor region, and the fifth semiconductor region is arranged at an inwardly-protruding end portion of the protruding part of the second semiconductor region.

In one embodiment, a width, in a circumferential direction, of the inwardly-protruding end portion of the part of the second semiconductor region increases in a direction from the center of the first semiconductor region toward an outer side of the semiconductor substrate.

In one embodiment, the second semiconductor region is arranged to have the protruding part protruding outwardly in a planar layout, toward an outer edge of the semiconductor substrate, and the fourth semiconductor region is arranged in the third semiconductor region at an outwardly-protruding end portion of the protruding part of the second semiconductor region.

In one embodiment, a width, in a circumferential direction, of the outwardly-protruding end portion of the part of the second semiconductor region decreases in a direction from the center of the first semiconductor region toward an outer side of the semiconductor substrate.

In one embodiment, the second semiconductor region contacts the first semiconductor region at a portion of the second semiconductor region other than the protruding part.

In one embodiment, the semiconductor device further includes a ninth semiconductor region of the first conductivity type selectively provided in the second semiconductor region; a tenth semiconductor region of the first conductivity type selectively provided in one of the first semiconductor region and the second semiconductor region, separate from the ninth semiconductor region, and farther inward toward a center of the first semiconductor region than the ninth semiconductor region; an eleventh semiconductor region of the first conductivity type selectively provided in an outward portion in the ninth semiconductor region, an impurity concentration of the eleventh semiconductor region being higher than that of the ninth semiconductor region; a second gate electrode provided on a surface of a portion of the second semiconductor region between the ninth semiconductor region and the tenth semiconductor region, the second gate electrode provided via a second gate insulating film; a fourth electrode contacting the tenth semiconductor region; and a fifth electrode contacting the eleventh semiconductor region. The eleventh semiconductor region is arranged at a position facing an outer side of the tenth semiconductor region. A distance between the tenth semiconductor region and the eleventh semiconductor region is longer than a distance between the seventh semiconductor region and the sixth semiconductor region.

In one embodiment, the second semiconductor region is arranged in a planar layout in which a first portion of the second semiconductor region contacts the first semiconductor region, and the first portion of the second semiconductor region protrudes inwardly toward a center of the first semiconductor region or outwardly away from the center of the first semiconductor region, or is arranged in a planar layout in which the first portion contacting the first semiconductor region protrudes both inwardly and outwardly.

In one embodiment, the semiconductor device further includes a twelfth semiconductor region of the second conductivity type on an outer side of the third semiconductor region.

According to another embodiment, a semiconductor device includes a first semiconductor region of a second conductivity type selectively provided on semiconductor substrate of a first conductivity type; a second semiconductor region of a second conductivity type surrounding a periphery of the first semiconductor region, a portion of the second semiconductor region contacting the first semiconductor region; a third semiconductor region of the first conductivity type surrounding a periphery of the second semiconductor region; a sixth semiconductor region of the second conductivity type selectively provided in one of the first semiconductor region and the second semiconductor region, an impurity concentration of the sixth semiconductor being higher than that of the second semiconductor region;

a seventh semiconductor region of the first conductivity type selectively provided in the third semiconductor region, an impurity concentration of the seventh semiconductor region being higher than that of the third semiconductor region; a first electrode contacting the seventh semiconductor region; a third electrode contacting the sixth semiconductor region; a ninth semiconductor region of the first conductivity type selectively provided in the second semiconductor region, separate from the sixth semiconductor region; a tenth semiconductor region of the first conductivity type selectively provided in the second semiconductor region, separate from the ninth semiconductor region, and farther inward than the ninth semiconductor region; an eleventh semiconductor region of the first conductivity type selectively provided in an outward portion in the ninth semiconductor region, an impurity concentration of the eleventh semiconductor region being higher than that of the ninth semiconductor region; a second gate electrode provided on a surface of a portion of the second semiconductor region between the ninth semiconductor region and the tenth semiconductor region, the second gate electrode provided via a second gate insulating film; a fourth electrode contacting the tenth semiconductor region; and a fifth electrode contacting the eleventh semiconductor region. The eleventh semiconductor region is arranged at a position facing an outer side of the tenth semiconductor region. A distance between the tenth semiconductor region and the eleventh semiconductor region is longer than a distance between the seventh semiconductor region and the sixth semiconductor region.

In one embodiment, the second semiconductor region is arranged in a planar layout in which the portion contacting the first semiconductor region protrudes inwardly toward a center of the first semiconductor region or outwardly away from the center of the first semiconductor region, or is arranged in a planar layout in which the portion contacting the first semiconductor region protrudes both inwardly and outwardly.

In one embodiment, the semiconductor device further includes a twelfth semiconductor region of the second conductivity type on an outer side of the third semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 5A is a plan view of a planar layout of a semiconductor device according to a second embodiment;
FIG. 15 is a cross-sectional view taken along a cutting-plane line E-E' of FIG. 13.

DETAILED DESCRIPTION OF THE INVENTION

Figure 1:
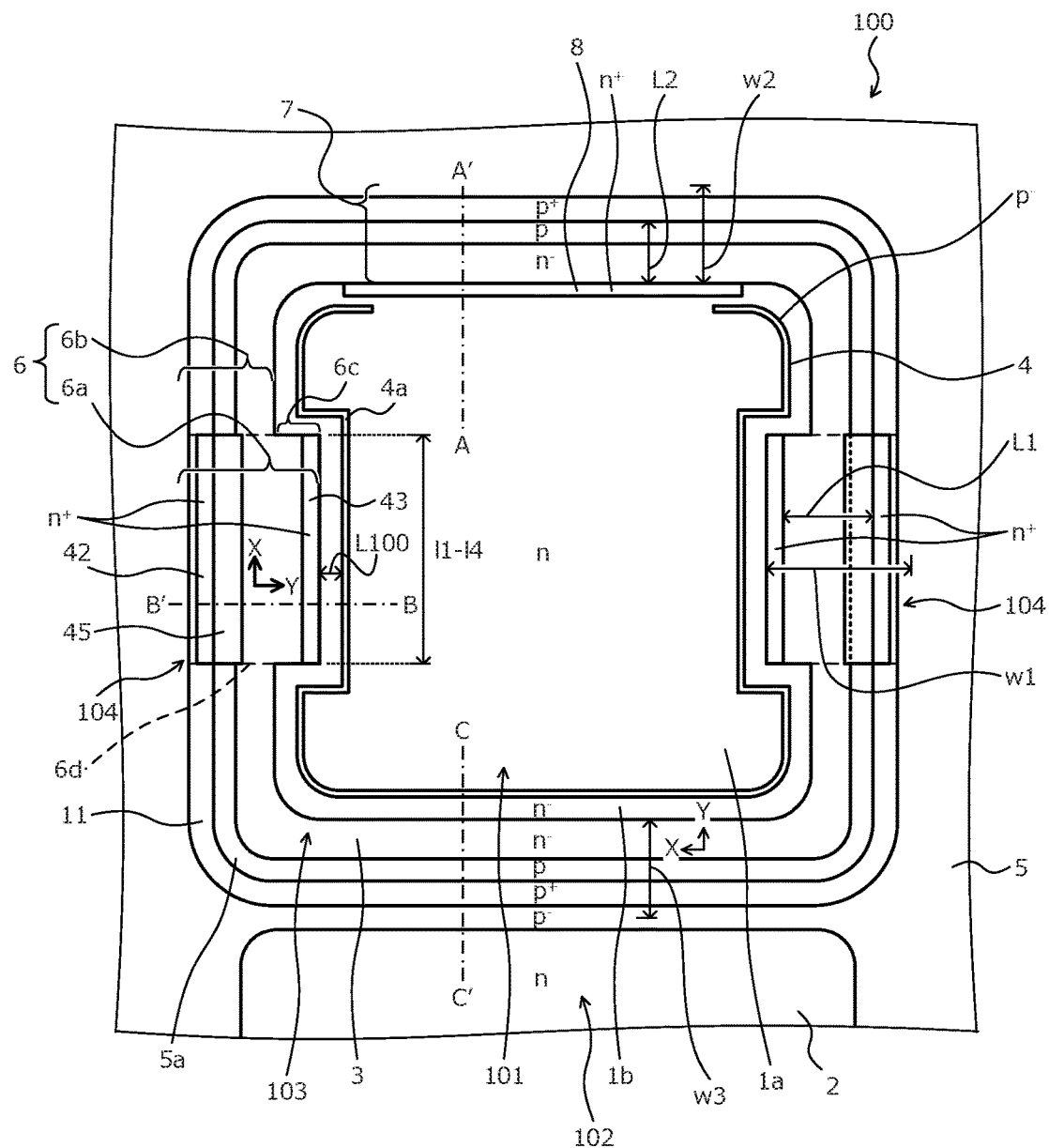
FIG. 1 is a plan view of a planar layout of a semiconductor device according to a first embodiment.

An embodiment of the present invention has a feature in that a distance (hereinafter referred to as a high-concentration inter-region distance) L1 between high-concentration regions of an nchMOSFET 104 is longer than a distance (hereinafter referred to as a high-concentration inter-region distance) L2 between high concentration regions of a parasitic diode 105 of an HVJT 103 (L1>L2) as described later. Therefore, the present invention may improve surge resistance of a semiconductor device overall.

However, in the conventional semiconductor devices depicted in FIGS. 20 to 24 described above, the parasitic diode of the HVJT 213 and the level shifter 214 have an equal drift length. A factor determining the drift length of the parasitic diode of the HVJT 213 is, for example, a length (width) between a cathode contact region (high-potential $n^+$-type region) and an anode contact region (low-potential $p^+$-type region) in a direction of flow of a drift current (i.e., a direction from the high potential side region 211 toward the low potential side region 212). A factor determining the drift length of the level shifter 214 is, for example, a length (width) between a drain region and a source region in the direction of flow of a drift current. Since these lengths determining the drift lengths are equal between the parasitic diode of the HVJT 213 and the level shifter 214, the parasitic diode of the HVJT 213 and the level shifter 214 have an equal off-state breakdown voltage. In FIGS. 20 to 22 and 24, the $n^+$-type cathode contact region, the $p^+$-type anode contact region, the drain region, and the source region are not depicted.

Since the parasitic diode of the HVJT 213 and the level shifter 214 have an equal off-state breakdown voltage, the following problem occurs. If a surge voltage such as electrostatic discharge (ESD) is input during an OFF state and avalanche breakdown occurs in the level shifter 214 and the parasitic diode of the HVJT 213 at the same time, a current (hereinafter referred to as an avalanche current) rapidly increases substantially uniformly in the level shifter 214 and the parasitic diode of the HVJT 213. Therefore, although local current concentration hardly occurs, in the level shifter 214 made up of an n-channel MOSFET, etc., parasitic operation is induced by the avalanche current and therefore, the level shifter 214 is easily damaged as compared to the parasitic diode of the HVJT 213. A method may be implemented by adjusting a level shift resistor to limit the avalanche current flowing through the level shifter 214 so as to eliminate the unbalance in breakdown voltage during the OFF state between the parasitic diode of the HVJT 213 and the level shifter 214; however, in this case, the level shift resistor is restricted in design.

As a result of intensive studies, the inventors also found the following. In the conventional semiconductor devices depicted in FIGS. 20 to 24, a circuit is designed such that high voltage is applied to the level shifter 214 in an ON state and therefore, on-state breakdown voltage must be ensured at a predetermined value. Since the on-state breakdown voltage of the level shifter 214 is generally lower than the off-state breakdown voltage, when the on-state breakdown voltage is ensured at a predetermined value, the drift length of the level shifter 214 becomes longer as compared to when only the off-state breakdown voltage is ensured at a predetermined value. Therefore, when the level shifter 214 ensures the on-state breakdown voltage at a predetermined value in the conventional semiconductor devices depicted in FIGS. 20 to 24 described above, the drift length of the parasitic diode of the HVJT 213 is increased by an amount corresponding to an increase in the drift length of the level shifter 214. Therefore, the drift length of the parasitic diode of the HVJT 213 becomes longer than the length capable of ensuring the off-state breakdown voltage at a predetermined value in the parasitic diode and thus, prevents a reduction in chip size. In the present invention, as described later, the chip size may be reduced by making a width of an n$^-$-type diffusion region 3 partly longer such that a protruding planar layout is arranged. The present invention was conceived based on such knowledge.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A semiconductor device according to a first embodiment will be described in terms of a configuration of a high voltage integrated circuit (HVIC). FIG. 1 is a plan view of a planar layout of the semiconductor device according to the first embodiment. For example, between two series-connected insulated gate bipolar transistors (IGBT) constituting one phase (not depicted) of a power conversion bridge circuit, an HVIC taken as an example in the description drives the IGBT on the high potential side (high side) (hereinafter referred to as an upper-arm IGBT). The semiconductor device according to the first embodiment depicted in FIG. 1 is the HVIC including a high potential side region 101 and a low potential side region 102 on a single semiconductor substrate (semiconductor chip) 100 such that the regions are electrically separated by an HVJT 103.

The high potential side region 101 includes an n-type diffusion region (first semiconductor region) 1a arranged in a substantially rectangular planar layout and an n$^-$-type diffusion region 1b arranged in a substantially rectangular frame-shaped planar layout surrounding the n-type diffusion region 1a. The n-type diffusion region 1a is electrically connected to a highest potential (high-side power-supply potential) H-VDD of a high-side circuit unit. In the n-type diffusion region 1a, the high-side circuit unit (not depicted) and constituent units of a level-up level shift circuit except an n-channel MOSFET (hereinafter referred to as an nch-MOSFET) 104 are arranged. A level shift resistor of the level-up level shift circuit is arranged in the n-type diffusion region 1a or the n$^-$-type diffusion region 1b. The high-side circuit unit is, for example, a complementary MOS (CMOS) circuit operating by using an emitter potential VS of the upper-arm IGBT of the power conversion bridge circuit as a reference potential to drive the upper-arm IGBT.

The low potential side region 102 is an n-type diffusion region (twelfth semiconductor region) 2 arranged separately from the n$^-$-type diffusion region 1b and farther on the outer side than the n$^-$-type diffusion region 1b. The n-type diffusion region 2 is fixed at a highest potential (low-side power-supply potential) L-VDD of a low-side circuit unit. In the n-type diffusion region 2, an internal circuit (the low-side circuit unit) not depicted and the like are arranged. The low-side circuit unit is, for example, a CMOS circuit operating by using a ground potential GND as a reference potential to drive the nchMOSFET 104 of the level-up level shift circuit. The n$^-$-type diffusion region (second semiconductor region) 3 serving as a voltage withstand region for sustaining a breakdown voltage is arranged between the n$^-$-type diffusion region 1b and the n-type diffusion region 2. The n$^-$-type diffusion region 3 is arranged in a substantially rectangular frame-shaped planar layout in contact with the n$^-$-type diffusion region 1b and surrounding a periphery of the n$^-$-type diffusion region 1b.

A first p$^-$-type separation region 4 is arranged in the n$^-$-type diffusion region 1b in a substantially U-shaped or substantially C-shaped planar layout surrounding a periphery of the n-type diffusion region 1a along three sides of the n$^-$-type diffusion region 1b. The first p$^-$-type separation region 4 may be in contact with the n-type diffusion region 1a or the n$^-$-type diffusion region 3, or may be provided in the n-type diffusion region 1a. When the region is provided in the n-type diffusion region 1a, the high-side circuit unit (not depicted) and constituent units of the level-up level shift circuit except the nchMOSFET 104 may be provided farther inward than the first p$^-$-type separation region 4. The n$^-$-type diffusion region 3 is electrically separated from the n-type diffusion region 2 by a second p$^-$-type separation region (third semiconductor region) 5 of the ground potential GND. The second p$^-$-type separation region 5 is in contact with the n$^-$-type diffusion region 3 and surrounds a periphery of the n$^-$-type diffusion region 3. The n$^-$-type diffusion region 3 and the second p$^-$-type separation region 5 are arranged in a concentric shape (substantially rectangular frame-shaped planar layout) surrounding a periphery of the high potential side region 101, for example.

In the second p$^-$-type separation region 5, a p$^+$-type contact region 11 is arranged separately from the n$^-$-type diffusion region 3 in a substantially rectangular frame-shaped planar layout surrounding the n$^-$-type diffusion region 3. The second p$^-$-type separation region 5 is electrically connected to an electrode (hereinafter referred to as a GND electrode) not depicted of the ground potential GND via a p$^+$-type contact region (seventh semiconductor region)

11 and is fixed at the ground potential GND. An inner portion (inward portion) 5a having a relatively high impurity concentration in the second p⁻-type separation region 5 functions as a p-type base region of the nchMOSFET 104 of the level-up level shift circuit. A parasitic diode 105 is formed by a pn junction between the second p⁻-type separation region 5 and the n⁻-type diffusion region 3 (see FIG. 2 described later). The HVJT 103 is made up of this parasitic diode 105. The p⁺-type contact region 11 functions as an anode contact region of the parasitic diode 105 of the HVJT 103.

In a portion (hereinafter referred to as a first HVJT portion) 6 of the n⁻-type diffusion region 3 facing the first p⁻-type separation region 4, the nchMOSFET 104 of the level-up level shift circuit is selectively arranged. The portion of the n⁻-type diffusion region 3 facing the first p⁻-type separation region 4 is a portion interposed between the first p⁻-type separation region 4 and the second p⁻-type separation region 5 described later. Therefore, the first HVJT portion 6 is a substantially U-shaped or substantially C-shaped portion corresponding to substantially three sides of the n⁻-type diffusion region 3. FIG. 1 depicts a case of arranging, for example, the two nchMOSFETs 104 in the first HVJT portion 6 (similarly in FIGS. 5A, 5B, 6, 7A, 7B, and 8). The first p⁻-type separation region 4 is a region for electrically separating the n-type diffusion region 1a at the highest potential (the high-side power-supply potential H-VDD) inside thereof and the nchMOSFET 104 arranged in the first HVJT portion 6. In this embodiment, by increasing a distance L100 between an n⁺-type drain region 43 of the nchMOSFET 104 and an n⁺-type region (sixth semiconductor region) 8 described later, short circuit is prevented between the n⁺-type drain region 43 of the nchMOSFET 104 and the n-type diffusion region 1a.

In the case of arranging the multiple nchMOSFETs 104, the nchMOSFETs 104 having the same configuration may be arranged at substantially equal distances from a portion (hereinafter referred to as a second HVJT portion) 7 of the n⁻-type diffusion region 3 not facing the first p⁻-type separation region 4. The reason is that the extent of variation in operation of the nchMOSFETs 104 due to noise, etc. can be made equal so as to prevent malfunction of the semiconductor device. The portion of the n⁻-type diffusion region 3 not facing the first p⁻-type separation region 4 is a portion of the n⁻-type diffusion region 3 other than the first HVJT portion 6 and is a portion in which the n⁻-type diffusion region 3 and the n-type diffusion region 1a are electrically connected because the first p⁻-type separation region 4 is not arranged. Therefore, the second HVJT portion 7 is a substantially linear portion corresponding to the remaining one side of the n⁻-type diffusion region 3. In the second HVJT portion 7, for example, a p-channel MOSFET (hereinafter referred to as a pchMOSFET) for detecting abnormality of a level-down level shift circuit may be arranged. A configuration with the pchMOSFET of the level-down level shift circuit arranged in the second HVJT portion 7 will be described in a tenth embodiment (see FIGS. 13 to 18). As described above, the nchMOSFET 104 and the pchMOSFET are arranged integrally with the parasitic diode 105 in the HVJT 103.

The n⁻-type diffusion region 3 is arranged in a planar layout in which a region (hereinafter referred to as an nchMOS region) 6a having the nchMOSFET 104 arranged therein protruding inwardly (toward the n-type diffusion region 1a) in a convex shape, and has a planar shape having a width w1 in the nchMOS region 6a made wider than widths w2, w3 of other portions. Therefore, the width w1 of the n⁻-type diffusion region 3 in the nchMOS region 6a is wider than the width w2 of the n⁻-type diffusion region 3 in the second HVJT portion 7 and the width w3 of the first HVJT portion 6 in a region (hereinafter referred to as a diode region) 6b other than the nchMOS region 6a (w1>w2, w1>w3). The widths w1 to w3 are the widths in a direction (hereinafter referred to as a radial direction) Y orthogonal to a direction (hereinafter referred to as a circumferential direction) X along the direction of extension of the n⁻-type diffusion region 3. In FIG. 1, a boundary 6d between the nchMOS region 6a and the diode region 6b is indicated by a coarse horizontal broken line (similarly in FIGS. 5A, 5B, 6, 7A, 7B, 8, and 13).

The widths w1, w2, and w3 are a length of the n⁻-type diffusion region 3 in the radial direction Y. For example, the width w1 of the n⁻-type diffusion region 3 in the nchMOS region 6a is a length in the radial direction Y of the n⁻-type diffusion region 3 in the nchMOS region 6a from a boundary with the n⁻-type diffusion region 1b to a boundary with an outer portion (outward portion) having a relatively low impurity concentration in the second p⁻-type separation region 5. The width w3 of the n⁻-type diffusion region 3 in the diode region 6b is a length in the radial direction Y of the n⁻-type diffusion region 3 in the diode region 6b from the boundary with the n⁻-type diffusion region 1b to the boundary with the outer portion having a relatively low impurity concentration in the second p⁻-type separation region 5. The width w2 of the n⁻-type diffusion region 3 in the second HVJT portion 7 is a length in the radial direction Y of a portion of the n⁻-type diffusion region 3 interposed between the n⁺-type region 8 and the outer portion having a relatively low impurity concentration in the second p⁻-type separation region 5. The n⁺-type region 8 functions as a cathode contact region of the parasitic diode 105 of the HVJT 103.

Since the width w1 of the n⁻-type diffusion region 3 in the nchMOS region 6a is increased inward as described above, the distance (hereinafter referred to as the high-concentration inter-region distance) L1 between the high-concentration regions of the nchMOSFET 104 is longer than the distance (hereinafter referred to as the high-concentration inter-region distance) L2 between the high concentration regions of the parasitic diode 105 of the HVJT 103 (L1>L2).

The high-concentration inter-region distance L1 of the nchMOSFET 104 is the distance (width) in the radial direction Y between an n⁺-type source region (fourth semiconductor region) 42 and the n⁺-type drain region (fifth semiconductor region) 43 of the nchMOSFET 104. The radial direction Y coincides with the direction of flow of the drift current (i.e., the direction from the high potential side region 101 toward the low potential side region 102). The high-concentration inter-region distance L1 of the nchMOSFET 104 is one of the factors determining the drift length of the nchMOSFET 104 and, when the high-concentration inter-region distance L1 of the nchMOSFET 104 is longer, the drift length of the nchMOSFET 104 becomes longer.

The high-concentration inter-region distance L2 of the parasitic diode 105 of the HVJT 103 is a length (width) in the radial direction Y between the n⁺-type cathode contact region (the n⁺-type region 8) and the p⁺-type anode contact region (p⁺-type contact region 11) of the parasitic diode 105 of the HVJT 103. The high-concentration inter-region distance L2 of the parasitic diode 105 of the HVJT 103 is one of the factors determining the drift length of the parasitic diode 105 of the HVJT 103 and, when the high-concentration inter-region distance L2 of the parasitic diode 105 of the HVJT 103 is longer, the drift length of the parasitic diode 105 of the HVJT 103 becomes longer. Therefore, the drift length of the nchMOSFET 104 is longer than the drift length of the parasitic diode 105 of the HVJT 103.

For example, the high-concentration inter-region distance L1 of the nchMOSFET 104 is set to a dimension capable of ensuring the breakdown voltage of the nchMOSFET 104 to an extent that destruction is not caused when avalanche current flows in an OFF state. In particular, for example, the high-concentration inter-region distance L1 of the nchMOSFET 104 may be set to about 90 μm and the high-concentration inter-region distance L2 of the parasitic diode 105 of the HVJT 103 may be set to about 80 μm.

The $n^+$-type source region 42, the $n^+$-type drain region 43, and a gate electrode 45 of the nchMOSFET 104 are arranged as follows. The $n^-$-type diffusion region 1b and the first $p^-$-type separation region 4 are arranged in a planar layout in which portions thereof facing the inside of the nchMOS region 6a of the $n^-$-type diffusion region 3 are curved inwardly in a concave shape along the nchMOS region 6a. The n-type diffusion region 1a is arranged in a planar layout in which a portion facing an inner side of the nchMOS region 6a of the $n^-$-type diffusion region 3 is recessed inward in a concave shape along a concave portion 4a of the first $p^-$-type separation region 4. The $n^+$-type drain region 43 is arranged in an inward portion of the nchMOS region 6a as far as possible. For example, the $n^+$-type drain region 43 may be arranged in an inwardly-protruding end portion 6c of the nchMOS region 6a, for example. The inwardly-protruding end portion 6c of the nchMOS region 6a is an inner portion of the nchMOS region 6a substantially surrounded by the concave portion 4a of the first $p^-$-type separation region 4.

The $n^+$-type source region 42 is arranged in an inner portion 5a of the second $p^-$-type separation region 5 on the inner side than the $p^+$-type contact region 11 so as to face the outside of the $n^+$-type drain region 43. The gate electrode 45 is arranged on a portion of the inner portion 5a of the second $p^-$-type separation region 5 interposed between the $n^-$-type diffusion region 3 and the $n^+$-type source region 42. Therefore, the $n^+$-type source region 42, the $n^+$-type drain region 43, and the gate electrode 45 are arranged in a stripe-shaped planar layout extending in the circumferential direction X in the nchMOS region 6a. A length (width) l2 of the $n^+$-type drain region 43 in the circumferential direction X, a length l3 of the $n^+$-type source region 42 in the circumferential direction X, and a length l4 of the gate electrode 45 in the circumferential direction X are substantially equal to a length l1 of the nchMOS region 6a in the circumferential direction X (l1=l2, l1=l3, l1=l4), for example. The length (width) l2 of the $n^+$-type drain region 43 in the circumferential direction X, the length l3 of the $n^+$-type source region 42 in the circumferential direction X, and the length l4 of the gate electrode 45 in the circumferential direction X are preferably substantially equal to each other (l2=l3=l4).

The $n^+$-type region 8 is arranged in the $n^-$-type diffusion region 1b in the second HVJT portion 7, for example, in a substantially linear planar layout along one side of the $n^-$-type diffusion region 1b, separately from the first $p^-$-type separation region 4. The end portions of the $n^+$-type region 8 may extend in the circumferential direction X to a position facing the outside of the first $p^-$-type separation region 4. For example, the $n^+$-type region 8 is arranged at a position closer than the first $p^-$-type separation region 4 to the boundary between the $n^-$-type diffusion region 1b and the $n^-$-type diffusion region 3. The $n^+$-type region 8 may be arranged in the $n^-$-type diffusion region 3 near the boundary with the $n^-$-type diffusion region 1b. The $n^+$-type region 8 may be in contact with the $n^-$-type diffusion region 3. The $n^+$-type region 8 is connected to an electrode not depicted of the high-side power-supply potential H-VDD (hereinafter referred to as an H-VDD electrode) and is fixed at the high-side power-supply potential H-VDD.

Figure 2:
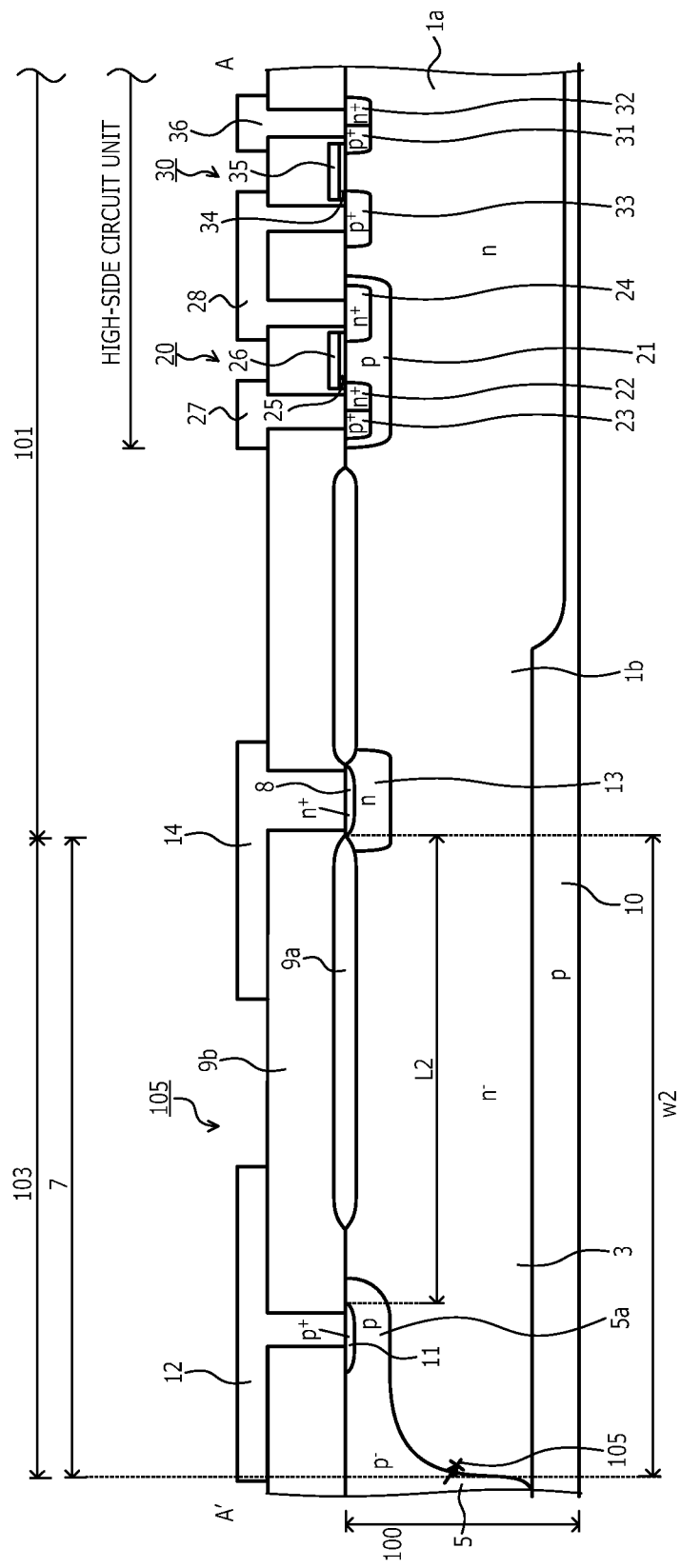
FIG. 2 is a cross-sectional view taken along a cutting-plane line A-A' of FIG. 1.
Figure 3:
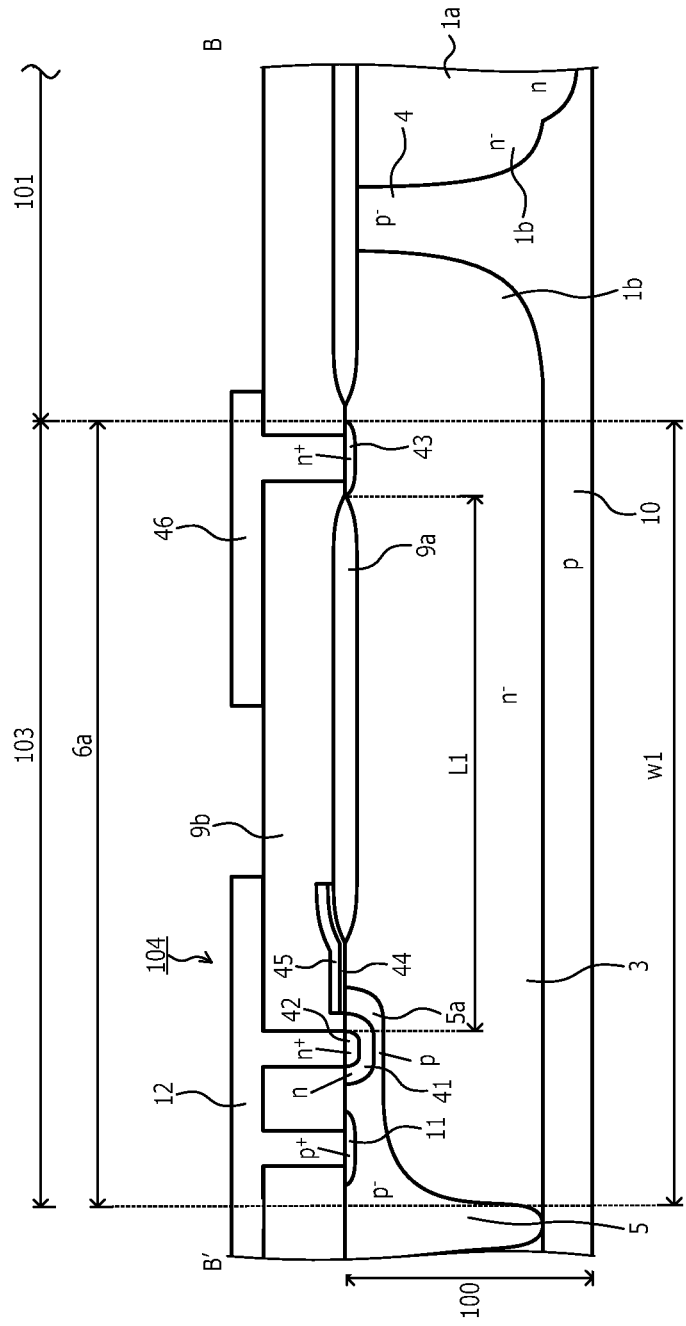
FIG. 3 is a cross-sectional view taken along a cutting-plane line B-B' of FIG. 1.
Figure 4:
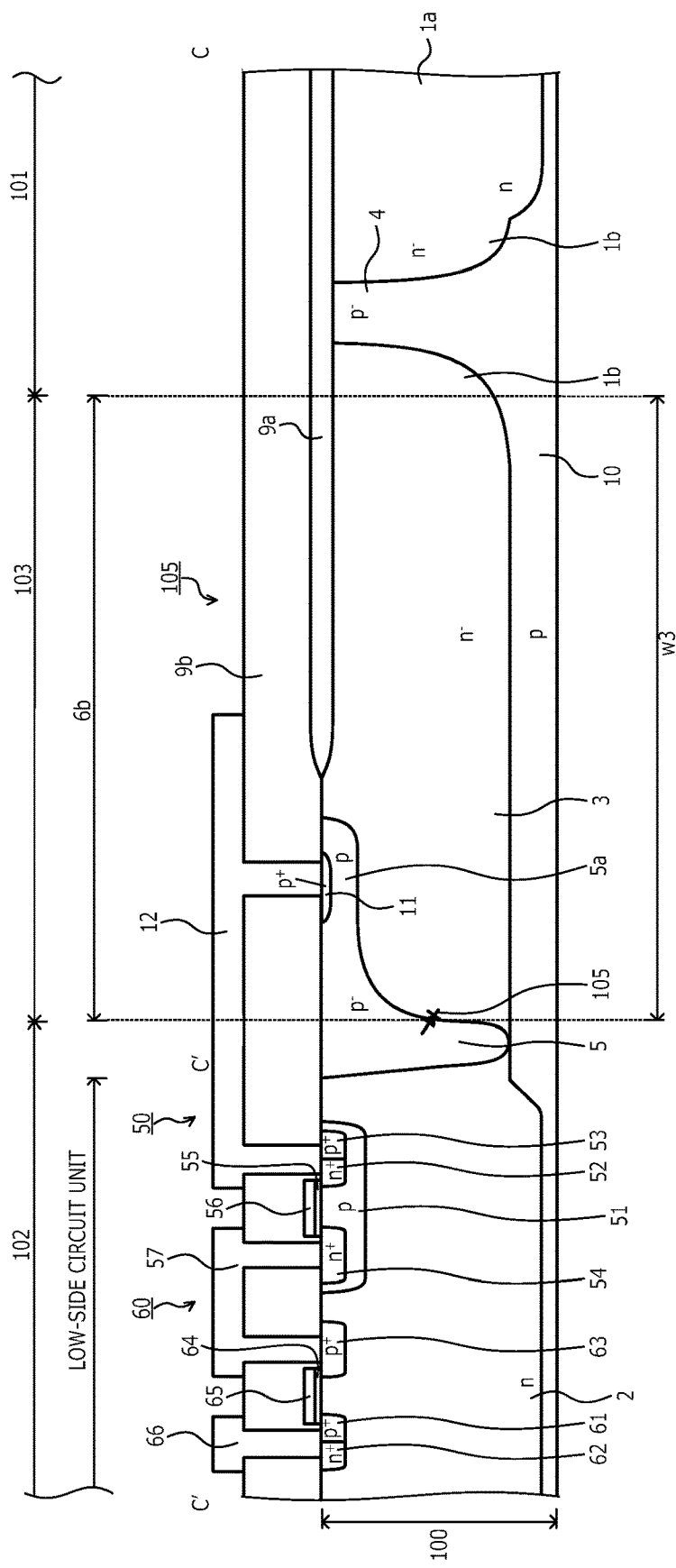
FIG. 4 is a cross-sectional view taken along a cutting-plane line C-C' of FIG. 1.

A cross-sectional structure of the semiconductor device according to the first embodiment will be described. FIG. 2 is a cross-sectional view taken along a cutting-plane line A-A' of FIG. 1. FIG. 3 is a cross-sectional view taken along a cutting-plane line B-B' of FIG. 1. FIG. 4 is a cross-sectional view taken along a cutting-plane line C-C' of FIG. 1. For example, FIG. 2 depicts a cross-sectional structure of the high-side circuit unit of the high-potential side region 101 and the second HVJT portion 7. FIG. 3 depicts a cross-sectional structure of the nchMOS region 6a of the first HVJT portion 6. FIG. 4 depicts a cross-sectional structure of the low-side circuit unit of the low potential side region 102 and the diode region 6b of the first HVJT portion 6. Therefore, FIGS. 2 and 4 depict the cross-sectional structure of the parasitic diode 105 of the HVJT 103, and FIG. 3 depicts the cross-sectional structure of the nchMOSFET 104.

As depicted in FIGS. 2 to 4, the n-type diffusion region 1a, the $n^-$-type diffusion region 1b, the n-type diffusion region 2, and the $n^-$-type diffusion region 3 are each selectively provided in a surface layer of a front surface of the p-type semiconductor substrate 100. The $n^-$-type diffusion region 1b is arranged farther outward than the n-type diffusion region 1a and is in contact with the n-type diffusion region 1a. The depth of the $n^-$-type diffusion region 1b is shallower than the depth of the n-type diffusion region 1a, for example. The $n^-$-type diffusion region 3 is arranged farther outward than the $n^-$-type diffusion region 1b and is in contact with the $n^-$-type diffusion region 1b. The depth of the $n^-$-type diffusion region 3 may be about the same as the depth of the $n^-$-type diffusion region 1b, for example. The n-type diffusion region 2 is arranged farther outward than the $n^-$-type diffusion region 3. The depth of the n-type diffusion region 2 is equal to or greater than the depth of the $n^-$-type diffusion region 3, for example.

The first $p^-$-type separation region 4 electrically separates the first HVJT portion 6 (the $n^-$-type diffusion region 3) and a portion (the n-type diffusion region 1a) in which the high-side circuit unit of the high potential side region 101 is arranged. For example, in the portion facing the inside of the first HVJT portion 6, the first $p^-$-type separation region 4 penetrates, for example, the $n^-$-type diffusion region 1b in the depth direction to separate the region into an inner portion and an outer portion. The first $p^-$-type separation region 4 may be a portion of the p-type semiconductor substrate 100 remaining in a slit shape exposed on the substrate front surface from a p-type region 10 on the substrate rear surface side. Being exposed on the substrate front surface means being arranged in contact with a Local Oxidation of Silicon (LOCOS: local oxidation) film 9a described later. The p-type region 10 on the substrate rear surface side is a portion remaining as a p-type region in a portion of the p-type semiconductor substrate 100 deeper than the n-type diffusion region 1a, the $n^-$-type diffusion region 1b, the n-type diffusion region 2, and the $n^-$-type diffusion region 3 from the substrate front surface because these regions are not formed. The p-type region 10 and the $n^-$-type diffusion region 3 constitute a single Reduced Surface Field (RESURF) structure.

In the surface layer of the $n^-$-type diffusion region 3 on the substrate front surface side, the second $p^-$-type separation region 5 is provided along the outer side of the $n^-$-type diffusion region 3. In the surface layer of the $n^-$-type diffusion region 3 on the substrate front surface side, a p-type diffusion region (not depicted) forming a double RESURF structure may be provided in a substantially rectangular frame-shaped planar layout surrounding the periphery of the n⁻-type diffusion region 1b. A configuration in the case of applying the double RESURF structure will be described in a tenth embodiment (see FIGS. 13 to 18). The second p⁻-type separation region 5 penetrates the n⁻-type diffusion region 3 in the depth direction and reaches the p-type region 10 on the substrate rear surface side. The inner portion 5a of the second p⁻-type separation region 5 extends inwardly and is at a depth shallower than the n⁻-type diffusion region 3. The p⁺-type contact region 11 is selectively provided in the inner portion 5a of the second p⁻-type separation region 5. The second p⁻-type separation region 5 is connected to a GND electrode (first electrode) 12 via the p⁺-type contact region 11.

As depicted in FIG. 2, the high-side circuit unit is arranged in the n-type diffusion region 1a. The high-side circuit unit is, for example, a CMOS circuit in which a lateral n-channel MOSFET 20 and a lateral p-channel MOSFET 30 are complementarily connected to each other. The lateral n-channel MOSFET 20 is arranged in a p-type well region 21 provided in the n-type diffusion region 1a. The lateral n-channel MOSFET 20 includes a general planar gate type MOS gate structure (an insulated gate made up of a metal oxide film semiconductor) made up of an n⁺-type source region 22, a p⁺-type contact region 23, an n⁺-type drain region 24, a gate insulating film 25, and a gate electrode 26. The n⁺-type source region 22 and the p⁺-type contact region 23 of the lateral n-channel MOSFET 20 are fixed at the reference potential of the high-side circuit unit (the emitter potential VS of the upper-arm IGBT) via a source electrode 27.

The lateral p-channel MOSFET 30 is arranged in the n-type diffusion region 1a. The lateral p-channel MOSFET 30 has a general planar gate type MOS gate structure made up of a p⁺-type source region 31, an n⁺-type contact region 32, a p⁺-type drain region 33, a gate insulating film 34, and a gate electrode 35. The p⁺-type source region 31 and the n⁺-type contact region 32 of the lateral p-channel MOSFET 30 are fixed at the high-side power-supply potential H-VDD via a source electrode 36. The n⁺-type drain region 24 of the lateral n-channel MOSFET 20 and the p⁺-type drain region 33 of the lateral p-channel MOSFET 30 are in contact with a drain electrode 28. The drain electrode 28 common to the lateral n-channel MOSFET 20 and the lateral p-channel MOSFET 30 is an output terminal of the high-side circuit unit outputting an output signal to a gate of the upper-arm IGBT.

As depicted in FIG. 4, the low-side circuit unit is arranged in the n-type diffusion region 2. The low-side circuit section is, for example, a CMOS circuit in which a lateral n-channel MOSFET 50 and a lateral p-channel MOSFET 60 are complementarily connected to each other. The lateral n-channel MOSFET 50 is arranged in a p-type well region 51 provided in the n-type diffusion region 2. The lateral n-channel MOSFET 50 includes a general planar gate type MOS gate structure made up of an n⁺-type source region 52, a p⁺-type contact region 53, an n⁺-type drain region 54, a gate insulating film 55, and a gate electrode 56. The GND electrode 12 is in contact with the n⁺-type source region 52 and the p⁺-type contact region 53 and functions as a source electrode of the lateral n-channel MOSFET 50.

The lateral p-channel MOSFET 60 is arranged in the n-type diffusion region 2. The lateral p-channel MOSFET 60 has a general planar gate type MOS gate structure made up of a p⁺-type source region 61, an n⁺-type contact region 62, a p⁺-type drain region 63, a gate insulating film 64, and a gate electrode 65. The p⁺-type source region 61 and the n⁺-type contact region 62 of the lateral p-channel MOSFET 60 are fixed at the highest potential (low-side power-supply potential) L-VDD of the low-side circuit unit via a source electrode 66. The n⁺-type drain region 54 of the lateral n-channel MOSFET 50 and the p⁺-type drain region 63 of the lateral p-channel MOSFET 60 are in contact with a drain electrode 57. The drain electrode 57 common to the lateral n-channel MOSFET 50 and the lateral p-channel MOSFET 60 is an input terminal of the low-side circuit unit receiving an input signal to a gate of a low-side C-MOS circuit not depicted connected to the level-up level shift circuit.

As depicted in FIG. 3, the n⁻-type diffusion region 3 has the nchMOSFET 104 of the level-up level shift circuit arranged in the nchMOS region 6a of the first HVJT portion 6. The nchMOSFET 104 includes a planar gate type MOS gate structure made up of the n⁺-type source region 42, the n⁺-type drain region 43, a gate insulating film 44, and the gate electrode 45. The n⁻-type diffusion region 3 also serves as an n⁻-type drift region. The n⁺-type source region 42 is selectively provided in the inner portion 5a of the second p⁻-type separation region 5. An n-type offset region 41 may be provided between the inner portion 5a of the second p⁻-type separation region 5 and the n⁺-type source region 42 so as to cover the n⁺-type source region 42. The n-type offset region 41 (the n⁺-type source region 42 when the n-type offset region 41 is not arranged) may be arranged in contact with the p⁺-type contact region 11. FIG. 3 depicts a case of arranging the n-type offset region 41 separately from the p⁺-type contact region 11.

The LOCOS film 9a is provided on the surface of the n⁻-type diffusion region 3 between the inner portion 5a of the second p⁻-type separation region 5 and the n⁺-type drain region 43. The gate electrode 45 is provided via the gate insulating film 44 on a surface of a portion of the inner portion 5a of the second p⁻-type separation region 5 interposed between the n-type offset region 41 and the n⁻-type diffusion region 3. The gate electrode 45 may extend toward the n⁺-type drain region 43 over the LOCOS film 9a covering the n⁻-type diffusion region 3. The GND electrode 12 is in contact with the n⁺-type source region 42 and is electrically insulated from the gate electrode 45 by an interlayer insulating film 9b. The GND electrode 12 functions as a source electrode of the nchMOSFET 104. The n⁺-type drain region 43 is in contact with a drain electrode (second electrode) 46. The drain electrode 46 is an output terminal of the nchMOSFET 104 and is an output terminal of the level-up level shift circuit.

As depicted in FIGS. 4 and 2, in the diode region 6b of the first HVJT portion 6 and the second HVJT portion 7, the parasitic diode 105 is formed by a pn junction between the second p⁻-type separation region 5 and the n⁻-type diffusion region 3. Therefore, the second p⁻-type separation region 5 and the n⁻-type diffusion region 3 function as an anode region and a cathode region, respectively, of the parasitic diode 105 of the HVJT 103. The p⁺-type contact region 11 and the GND electrode 12 function as an anode contact region and an anode electrode, respectively, of the parasitic diode 105 of the HVJT 103. The n⁺-type region 8 and an H-VDD electrode 14 function as a cathode contact region and a cathode electrode, respectively, of the parasitic diode 105 of the HVJT 103. An n-type offset region 13 (not depicted in FIG. 1 and FIGS. 5A, 5B, 6, 7A, 7B, and 8 described later) may be provided between the n$^+$-type region 8 and the n$^-$-type diffusion region 3 so as to cover the n$^+$-type region 8.

As described above, according to the first embodiment, by arranging the n$^-$-type diffusion region (voltage withstand region) in a planar layout in which the nchMOS region protrudes inwardly in a convex shape, the drift length of the nchMOSFET in the nchMOS region may be longer than the drift length of the parasitic diode of the HVJT. As a result, the electric field applied to the drift region of the nchMOS-FET in the nchMOS region may be mitigated, and the off-state breakdown voltage of the nchMOSFET in the nchMOS region may be higher than the off-state breakdown voltage of the parasitic diode of the HVJT. Therefore, even when a surge voltage such as ESD is input during the OFF state and avalanche breakdown occurs in the nchMOSFET in the nchMOS region and the parasitic diode of the HVJT at the same time, the avalanche current mainly flows through a region other than the nchMOS region of the HVJT in which parasitic operation does not occur (the diode region of the first HVJT portion and the second HVJT portion). Thus, the avalanche current causing the parasitic operation in the nchMOSFET in the nchMOS region may be controlled from flowing into the nchMOSFET in the nchMOS region. As a result, the surge resistance of the overall semiconductor device may be improved.

According to the first embodiment, the electric field applied to the drift region of the nchMOSFET in the nchMOS region may be mitigated, and therefore, an occurrence of an impact ion phenomenon at the end portion of the drift region of the nchMOSFET in the nchMOS region may be suppressed. As a result, a substrate current (current flowing from the gate electrode side toward the p-type region on the substrate rear surface side) that flows when the nchMOSFET is turned on while a high voltage is applied between the drain and the source of the nchMOSFET in the nchMOS region may be suppressed. Therefore, the on-state breakdown voltage of the nchMOSFET in the nchMOS region may also be improved. According to the first embodiment, it is not necessary to increase the drift length of the parasitic diode of the HVJT according to the drift length of the nchMOSFET in the nchMOS region and therefore, increases in the chip area may be minimized. Thus, the reliability may be improved by enhancing the ESD resistance as well as the on-state breakdown voltage and the off-state breakdown voltage of the nchMOSFET in the nchMOS region, and the chip size may be reduced.

According to the first embodiment, the avalanche current flowing into the nchMOSFET in the nchMOS region may be suppressed by the arrangement of the nchMOS region alone. Therefore, as compared to the structure in which the avalanche current flowing into the nchMOSFET in the nchMOS region is suppressed by, for example, the level shift resistor alone made up of the n$^-$-type diffusion region (voltage withstand region) near the boundary of the first and second HVJT portions, the degree of freedom in design is high.

Figure 5B:
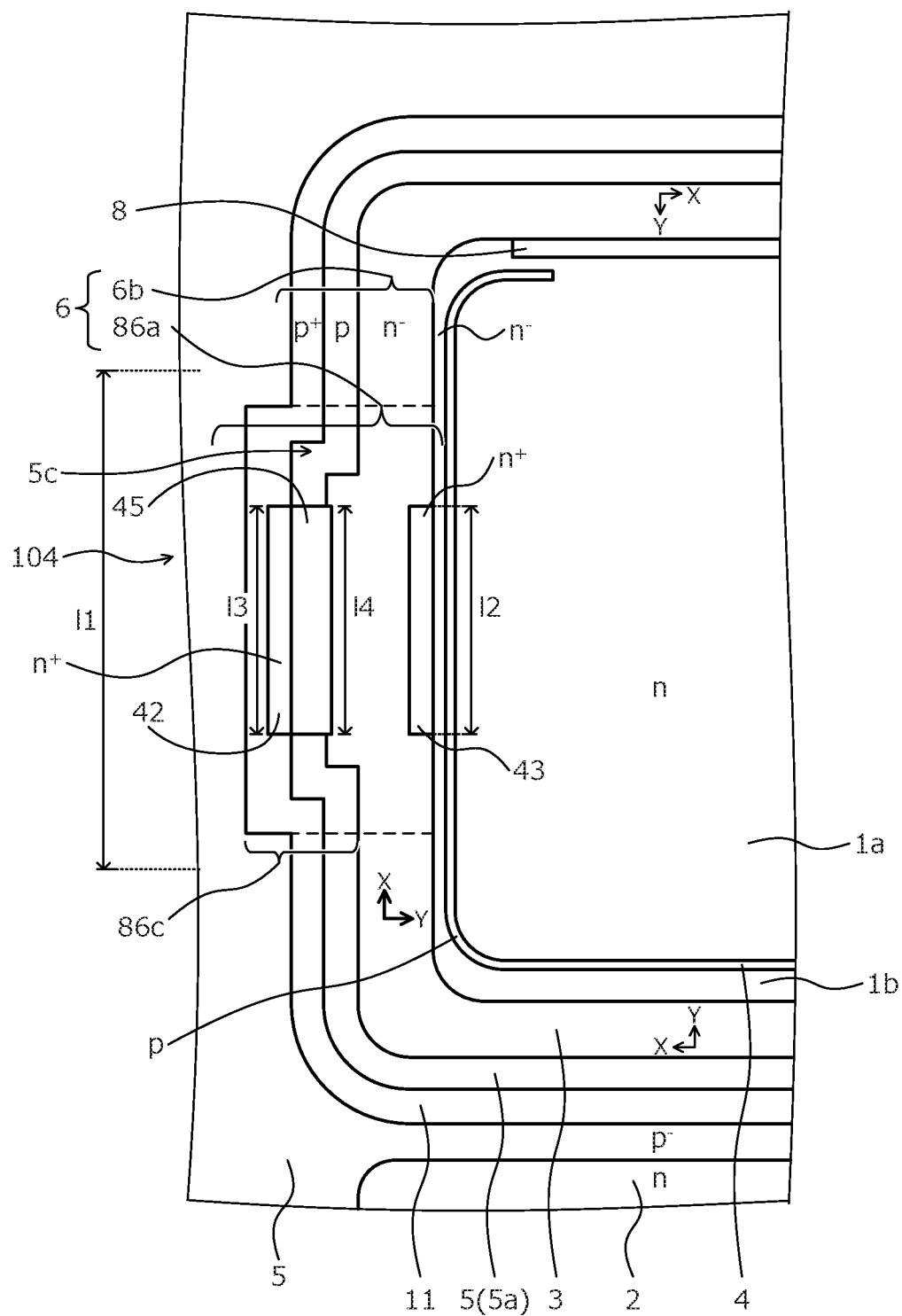
FIG. 5B is an enlarged plan view of a main part of FIG. 5A.

A configuration of a semiconductor device according to a second embodiment will be described. FIG. 5A is a plan view of a planar layout of the semiconductor device according to the second embodiment. FIG. 5B is an enlarged plan view of a main part of FIG. 5A. FIG. 5B depicts an enlarged view of an nchMOS region 86a of FIG. 5A. The cross-sectional structures along the cutting-plane lines A-A', B-B', and C-C' of FIG. 5A are similar to those in the first embodiment (see FIGS. 2 to 4, respectively).

The semiconductor device according to the second embodiment differs from the semiconductor device according to the first embodiment in that the nchMOS region 86a is arranged in a planar layout protruding outwardly (away from the n-type diffusion region 1a) in a convex shape so as to make the width w1 in the nchMOS region 86a of the n$^-$-type diffusion region 3 larger than the widths w2, w3 of other portions. Therefore, as depicted in FIG. 5A, the second p$^-$-type separation region 5 and the p$^+$-type contact region 11 are arranged in a planar layout in which a portion facing the outer side of the nchMOS region 86a of the n$^-$-type diffusion region 3 is curved outwardly in a concave shape along the nchMOS region 86a.

As depicted in FIG. 5B, the n$^+$-type source region 42 is arranged on the outer side of an outwardly-protruding end portion 86c of the nchMOS region 86a. The gate electrode 45 is arranged on the surface of the outwardly-protruding end portion 86c of the nchMOS region 86a in the second p$^-$-type separation region 5. The n$^+$-type drain region 43 is arranged at the innermost portion of the nchMOS region 86a so as to face the inner side of the n$^+$-type source region 42.

A length l2 of the n$^+$-type drain region 43 in the circumferential direction X, a length l3 of the n$^+$-type source region 42 in the circumferential direction X, and a length l4 of the gate electrode 45 in the circumferential direction X may be shorter than a length l1 of the nchMOS region 86a in the circumferential direction X, for example. The reason is that when an end portion of the gate electrode 45 is located at a step portion 5c of the second p$^-$-type separation region 5, the nchMOSFET 104 may be damaged due to concentration of current at the step portion 5c of the second p$^-$-type separation region 5.

Even when the width w1 of the n$^-$-type diffusion region 3 in the nchMOS region 86a is increased toward the outside, the high-concentration inter-region distance L1 of the nchMOSFET 104 may be longer than the high-concentration inter-region distance L2 of the parasitic diode 105 of the HVJT 103. The configuration of the semiconductor device according to the first embodiment may be applied to the semiconductor device according to the second embodiment to arrange the nchMOS region in a planar layout protruded both inwardly and outwardly in a convex shape.

As described above, according to the second embodiment, effects similar to those of the first embodiment may be obtained.

Figure 6:
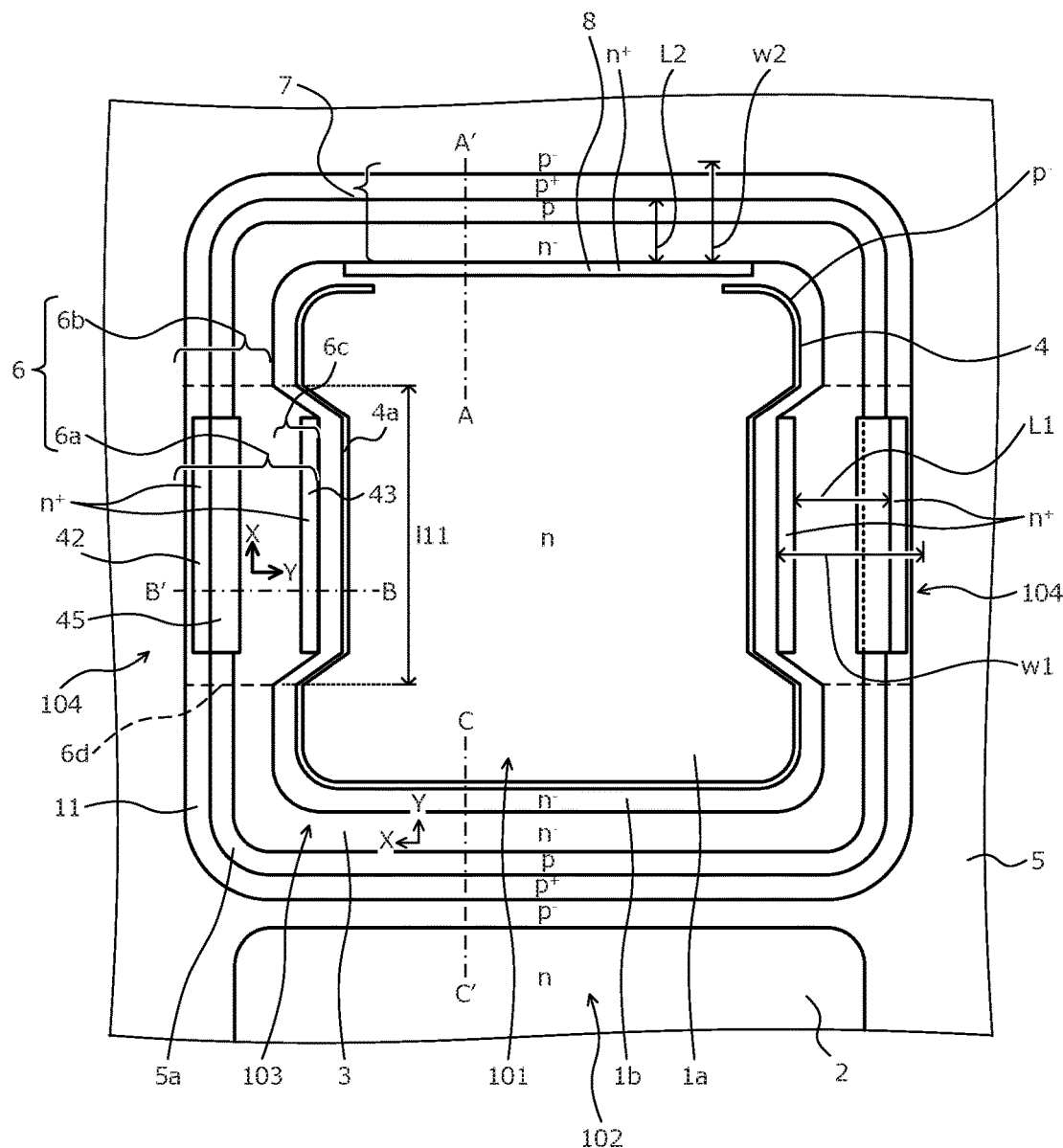
FIG. 6 is a plan view of a planar layout of a semiconductor device according to a third embodiment.

A structure of a semiconductor device according to a third embodiment will be described. FIG. 6 is a plan view of a planar layout of the semiconductor device according to the third embodiment. The cross-sectional structures along the cutting-plane lines A-A', B-B', and C-C' of FIG. 6 are similar to those in the first embodiment (see FIGS. 2 to 4, respectively).

The semiconductor device according to the third embodiment differs from the semiconductor device according to the first embodiment in that a length (width) l11 of the inwardly-protruding end portion 6c of the nchMOS region 6a in the circumferential direction X is longer on the outer side. Therefore, the high-concentration inter-region distance L1 becomes shorter as the nchMOSFET 104 approaches a boundary (indicated by a coarse horizontal broken line) 6d between the nchMOS region 6a and the diode region 6b. As a result, the concentration of the electric field may be mitigated near the boundary 6d between the nchMOS region 6a and the diode region 6b, and a local reduction in breakdown voltage may be suppressed.

As described above, according to the third embodiment, effects similar to those of the first and second embodiments may be obtained.

Figure 7A:
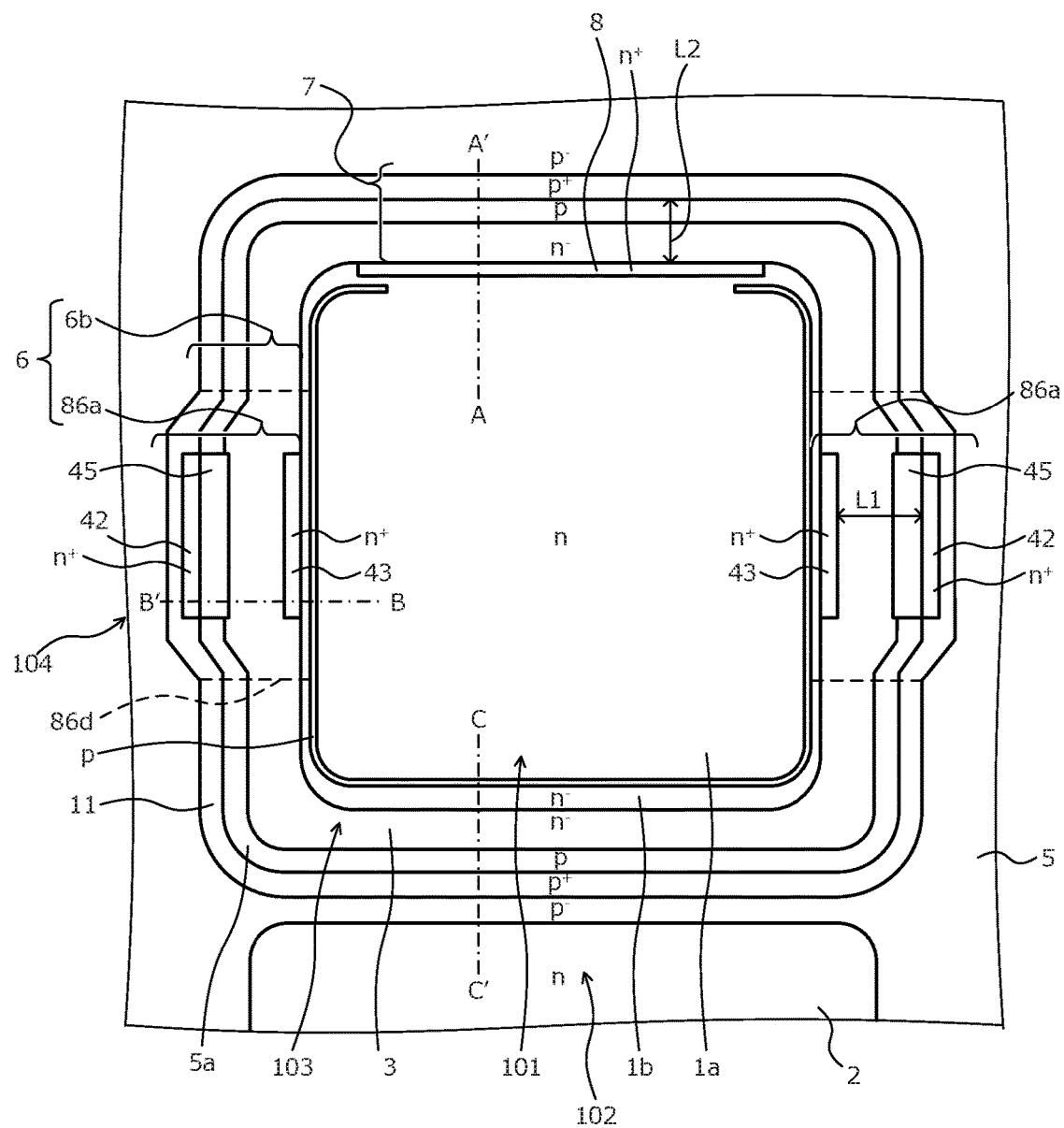
FIG. 7A is a plan view of a planar layout of a semiconductor device according to a fourth embodiment.
Figure 7B:
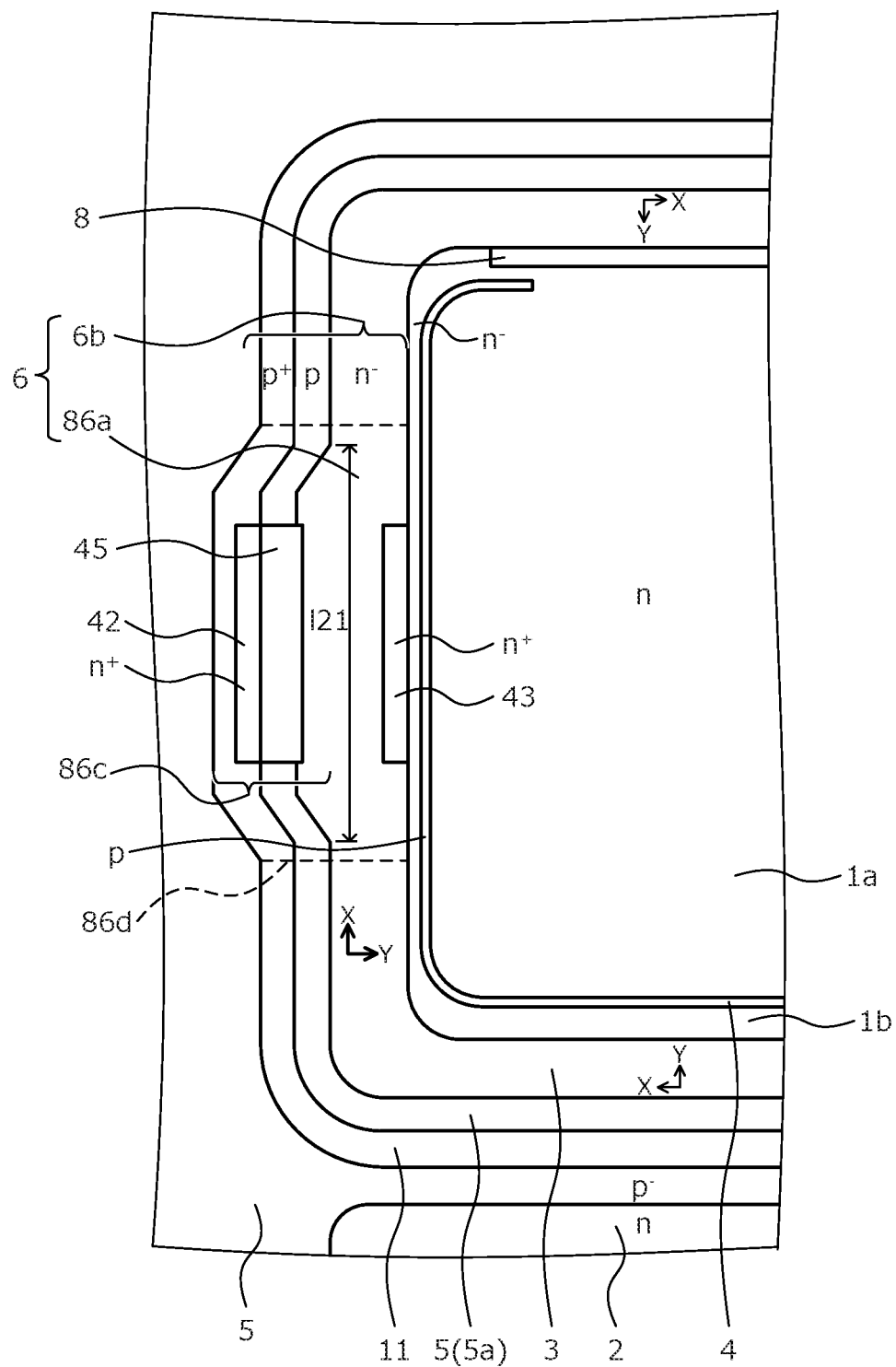
FIG. 7B is an enlarged plan view of a main part of FIG. 7A.

A structure of a semiconductor device according to a fourth embodiment will be described. FIG. 7A is a plan view of a planar layout of the semiconductor device according to the fourth embodiment. FIG. 7B is an enlarged plan view of a main part of FIG. 7A. FIG. 7B depicts an enlarged view of the nchMOS region 86a of FIG. 7A. The cross-sectional structures along the cutting-plane lines A-A', B-B', and C-C' of FIG. 7A are similar to those in the first embodiment (see FIGS. 2 to 4, respectively).

The semiconductor device according to the fourth embodiment differs from the semiconductor device according to the second embodiment in that a length (width) 121 of the outwardly-protruding end portion 86c of the nchMOS region 6a in the circumferential direction X is longer on the inner side. Therefore, the high-concentration inter-region distance L1 becomes shorter as the nchMOSFET 104 approaches a boundary (indicated by a coarse horizontal broken line) 86d between the nchMOS region 86a and the diode region 6b. In FIGS. 7A and 7B, the boundary 86d between the nchMOS region 86a and the diode region 6b is indicated by a coarse horizontal broken line (similarly in FIG. 18). As a result, the concentration of the electric field may be mitigated near the boundary 86d between the nchMOS region 86a and the diode region 6b, and a local reduction in breakdown voltage may be suppressed.

The configuration of the semiconductor device according to the third embodiment may be applied to the semiconductor device according to the fourth embodiment to arrange the nchMOS region in a planar layout protruding both inwardly and outwardly in a convex shape.

As described above, according to the fourth embodiment, effects similar to those of the first to third embodiments may be obtained.

Figure 8:
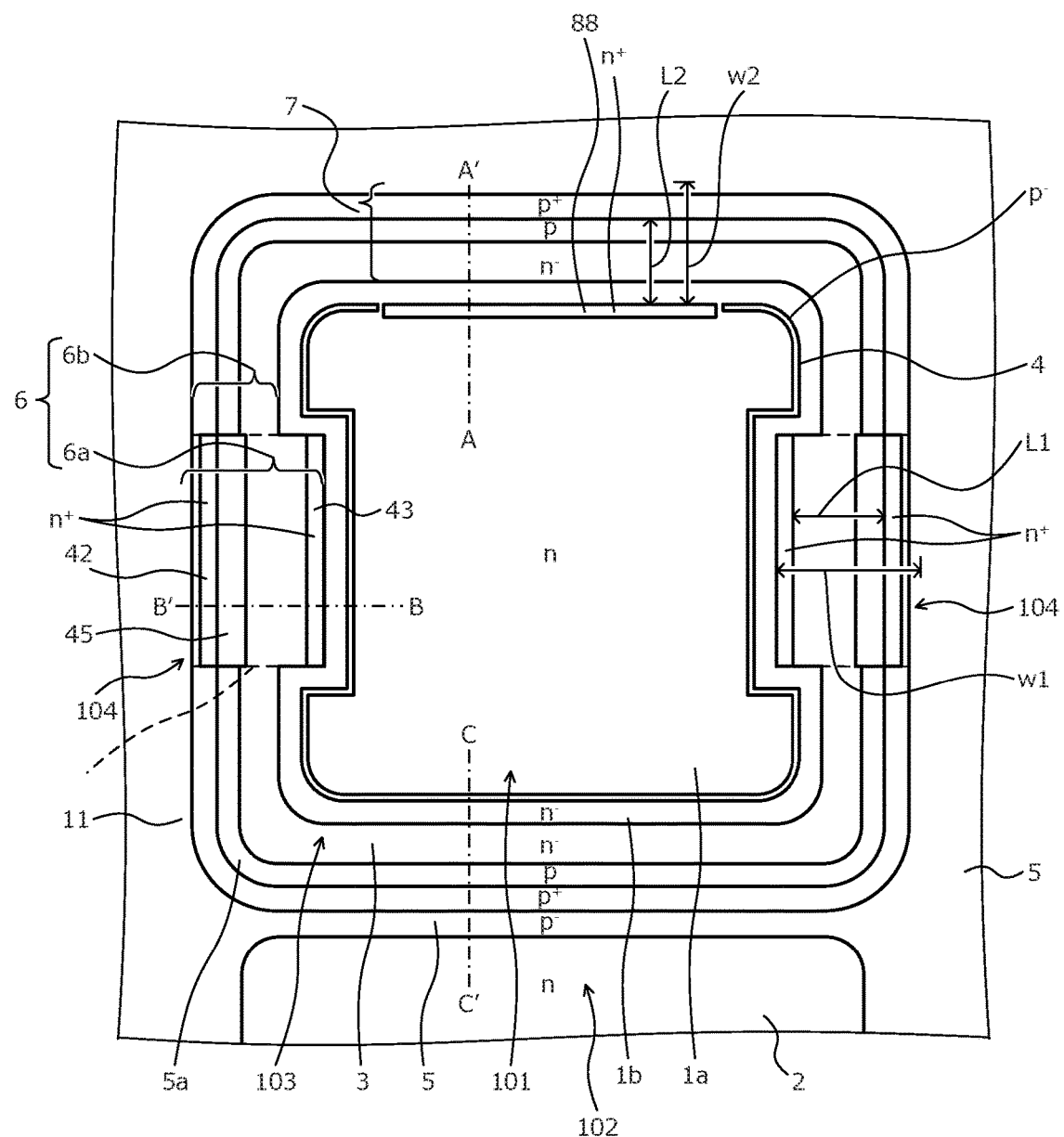
FIG. 8 is a plan view of a planar layout of a semiconductor device according to a fifth embodiment.

The structure of a semiconductor device according to a fifth embodiment will be described. FIG. 8 is a plan view of a planar layout of the semiconductor device according to the fifth embodiment. The semiconductor device according to the fifth embodiment differs from the semiconductor device according to the first embodiment in that the p⁻-type separation region 4 and an n⁺-type region 88 of the high-side power-supply potential H-VDD have substantially the same distance from the boundary between the n⁻-type diffusion region 1b and the n⁻-type diffusion region 3 in the second HVJT portion 7. Similar to the first embodiment, the high-concentration inter-region distance L1 of the nchMOSFET 104 is longer than the high-concentration inter-region distance L2 of the parasitic diode 105 of the HVJT 103. The cross-sectional structures along the cutting-plane lines A-A', B-B', and C-C' of FIG. 8 are similar to those in the first embodiment (see FIGS. 2 to 4, respectively).

The configuration of the semiconductor device according to the fifth embodiment may be applied to the semiconductor devices according to the second to fourth embodiments.

As described above, according to the fifth embodiment, effects similar to those of the first to fourth embodiments may be obtained regardless of the arrangement of the n⁺-type region of the high-side power-supply potential.

Figure 9:
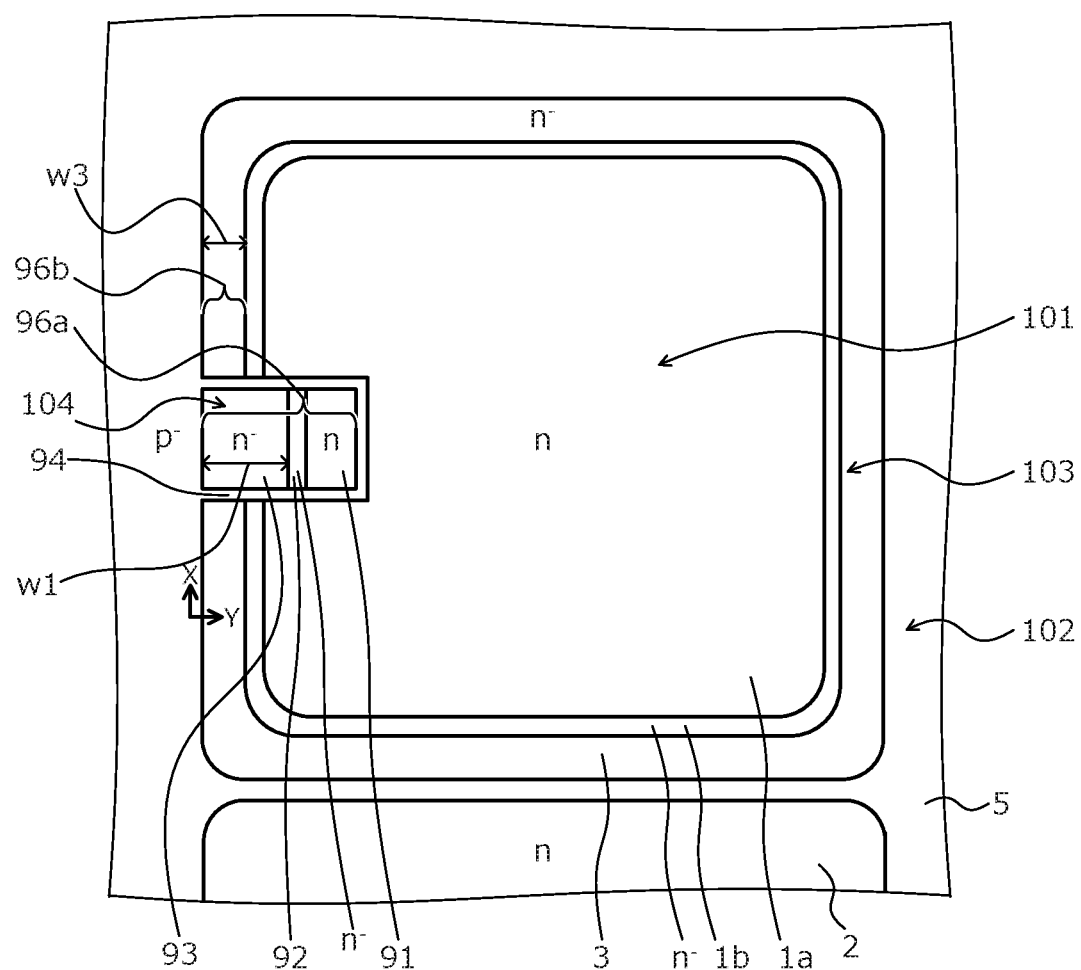
FIG. 9 is a plan view of a planar layout of a semiconductor device according to a sixth embodiment.

The structure of a semiconductor device according to a sixth embodiment will be described. FIG. 9 is a plan view of a planar layout of the semiconductor device according to the sixth embodiment. The semiconductor device according to the sixth embodiment differs from the semiconductor device according to the first embodiment in that the nchMOSFET 104 of the level-up level shift circuit is arranged continuously in the HVJT 103 and the high potential side region 101.

For example, in the n-type diffusion region 1a and the n⁻-type diffusion regions 1b, 3, a p⁻-type separation region 94 is arranged in a substantially U-shaped planar layout extending from the low potential side region 102 through the HVJT 103 and the high potential side region 101 and returning to the low potential side region 102. The p⁻-type separation region 94 electrically separates portions 91 to 93 of the continuous portions of the n-type diffusion region 1a and the n⁻-type diffusion regions 1b, 3 from other portions. The nchMOSFET 104 of the level-up level shift circuit is arranged in an nchMOS region 96a made up of the portions 91 to 93 surrounded by the p⁻-type separation region 94. The nchMOS region 96a is arranged in a planar layout protruding inwardly in a convex shape relative to a diode region 96b.

Furthermore, the width w1 of the nchMOS region 96a in the radial direction Y is larger than the width w3 of the diode region 96b in the radial direction Y. As a result, even when the periphery of the nchMOSFET 104 is surrounded by the p⁻-type separation region 94 and electrically separated from the high potential side, the drift length of the nchMOSFET 104 may be made longer than the drift length of the parasitic diode of the HVJT 103. Similar to the second embodiment, the nchMOS region may be arranged in a planar layout protruding outwardly in a convex shape relative to the diode region. The configuration of the semiconductor device according to the second embodiment may be applied to the semiconductor device according to the sixth embodiment to arrange the nchMOS region in a planar layout protruding both inwardly and outwardly in a convex shape.

As described above, according to the sixth embodiment, even when the periphery of the nchMOSFET is surrounded by the p⁻-type separation region and electrically separated from the high potential side, effects similar to those of the first and second embodiments may be obtained.

Figure 10:
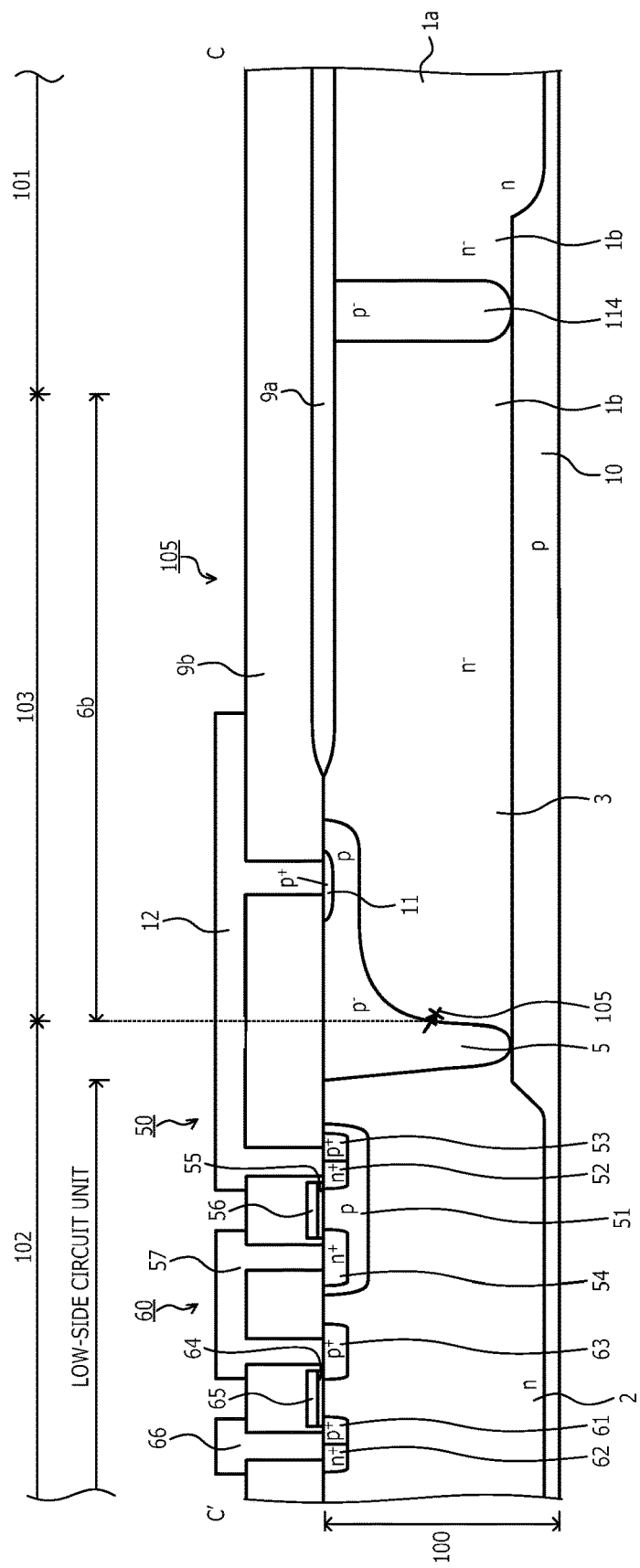
FIG. 10 is a cross-sectional view of a structure of a semiconductor device according to a seventh embodiment.

A structure of a semiconductor device according to a seventh embodiment will be described. FIG. 10 is a cross-sectional view of the structure of the semiconductor device according to the seventh embodiment. The seventh embodiment is a modification example of the first embodiment. FIG. 10 depicts the cross-sectional structure taken along the cutting-plane line C-C' of FIG. 1, i.e., the cross-sectional structure of the diode region 6b of the first HVJT portion 6. The semiconductor device according to the seventh embodiment differs from the semiconductor device according to the first embodiment in that a p⁻-type separation region 114 electrically separating the n-type diffusion region 1a and the n⁻-type diffusion region 3 is a diffusion region. The p⁻-type separation region 114 may penetrate the n⁻-type diffusion region 1b (or the n⁻-type diffusion region 3) in the depth direction to reach the p-type region 10 on the substrate rear surface side and may be formed at the same ion implantation step as the second p⁻-type separation region 5, for example.

The configuration of the semiconductor device according to the seventh embodiment may be applied to the semiconductor devices according to the second to sixth embodiments.

As described above, according to the seventh embodiment, even when the p⁻-type separation region electrically separating the high potential side region and the HVJT is made up of a diffusion region, effects similar to those of the first to sixth embodiments may be obtained.

Figure 11:
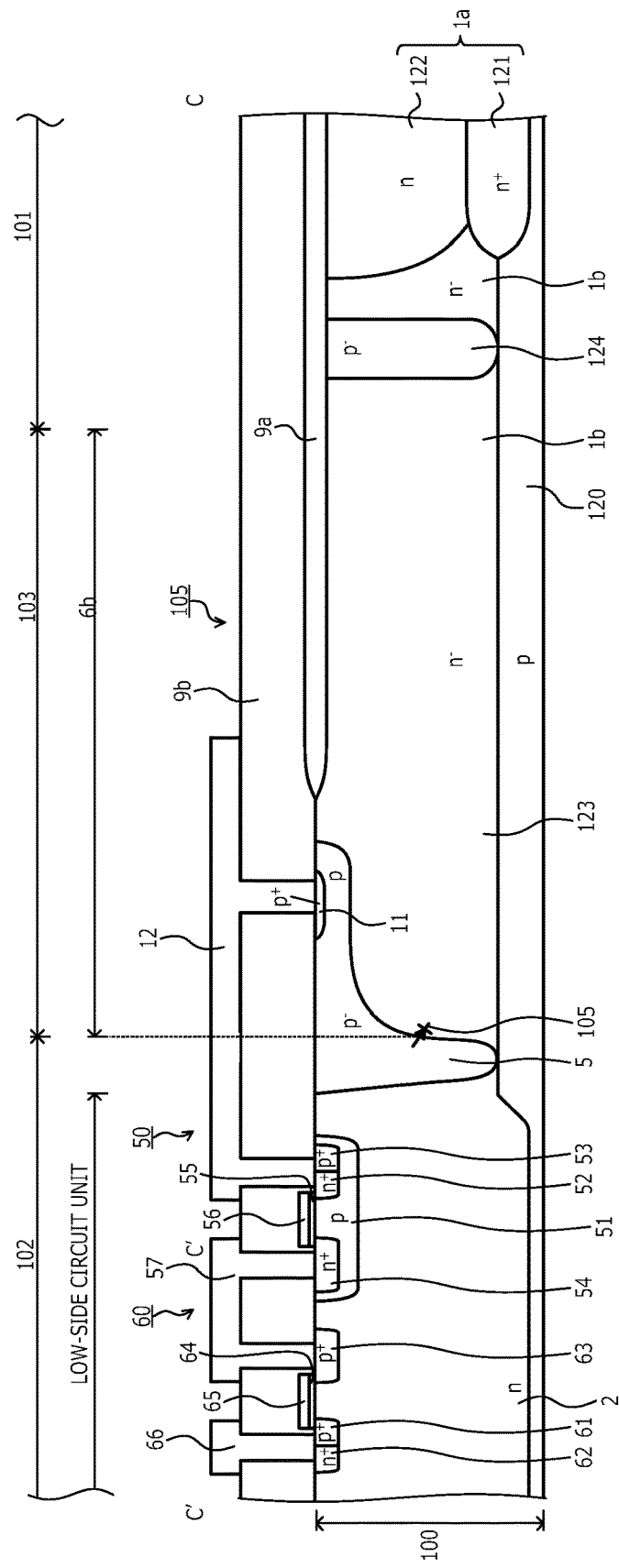
FIG. 11 is a cross-sectional view of a structure of a semiconductor device according to an eighth embodiment.

A structure of a semiconductor device according to an eighth embodiment will be described. FIG. 11 is a cross-sectional view of the structure of the semiconductor device according to the eighth embodiment. The eighth embodiment is a modification example of the first embodiment.

FIG. 11 depicts the cross-sectional structure taken along the cutting-plane line C-C' of FIG. 1, i.e., the cross-sectional structure of the diode region 6b of the first HVJT portion 6. The semiconductor device according to the eighth embodiment differs from the semiconductor device according to the seventh embodiment on the following two points. The first difference is that the semiconductor substrate 100 is configured by providing an n⁻-type epilayer 123 made up of an n⁻-type epitaxial layer on a p-type support substrate 120. The second difference is that the n-type diffusion region 1a having the high-side circuit unit arranged therein has a two-layer structure of an n⁺-type embedded layer 121 and an n-type diffusion region 122.

For example, as depicted in FIG. 11, the n⁻-type epilayer 123 made up of the n⁻-type epitaxial layer is provided on the front surface of the p-type support substrate 120. In the high potential side region 101, the n⁺-type embedded layer 121 is provided at an interface between the p-type support substrate 120 and the n⁻-type epilayer 123. In the high potential side region 101, the n-type diffusion region 122 is provided in the surface layer of the n⁻-type epilayer 123 on the side thereof opposite that facing the p-type support substrate 120. The n-type diffusion region 122 reaches the n⁺-type embedded layer 121. The n⁺-type embedded layer 121 and the n-type diffusion region 122 constitute the n-type diffusion region 1a having the high-side circuit unit arranged therein.

The n⁺-type embedded layer 121 may be omitted. In this case, the n-type diffusion region 122 may be provided to a depth penetrating the n⁻-type epilayer 123 in the depth direction and reaching the p-type support substrate 120. In the high potential side region 101, a p⁻-type separation region 124 penetrates the n⁻-type epilayer 123 in the depth direction and reaches the p-type support substrate 120. The p⁻-type separation region 124 electrically separates the n-type diffusion region 1a having the high-side circuit unit of the high potential side region 101 arranged therein, and the HVJT 103. The second p⁻-type separation region 5 penetrates the n⁻-type epilayer 123 in the depth direction and reaches the p-type support substrate 120. The second p⁻-type separation region 5 may be formed at the same ion implantation step as the p⁻-type separation region 124, for example. The n⁻-type epilayer 123 corresponds to the n⁻-type diffusion regions 1b, 3 of FIG. 1.

The configuration of the semiconductor device according to the eighth embodiment may be applied to the semiconductor devices according to the second to sixth embodiments.

As described above, according to the eighth embodiment, even in a case of using an epitaxial substrate having an epitaxial layer serving as an n⁻-type epilayer region stacked on a p-type support substrate, effects similar to those of the first to sixth embodiments may be obtained.

Figure 12:
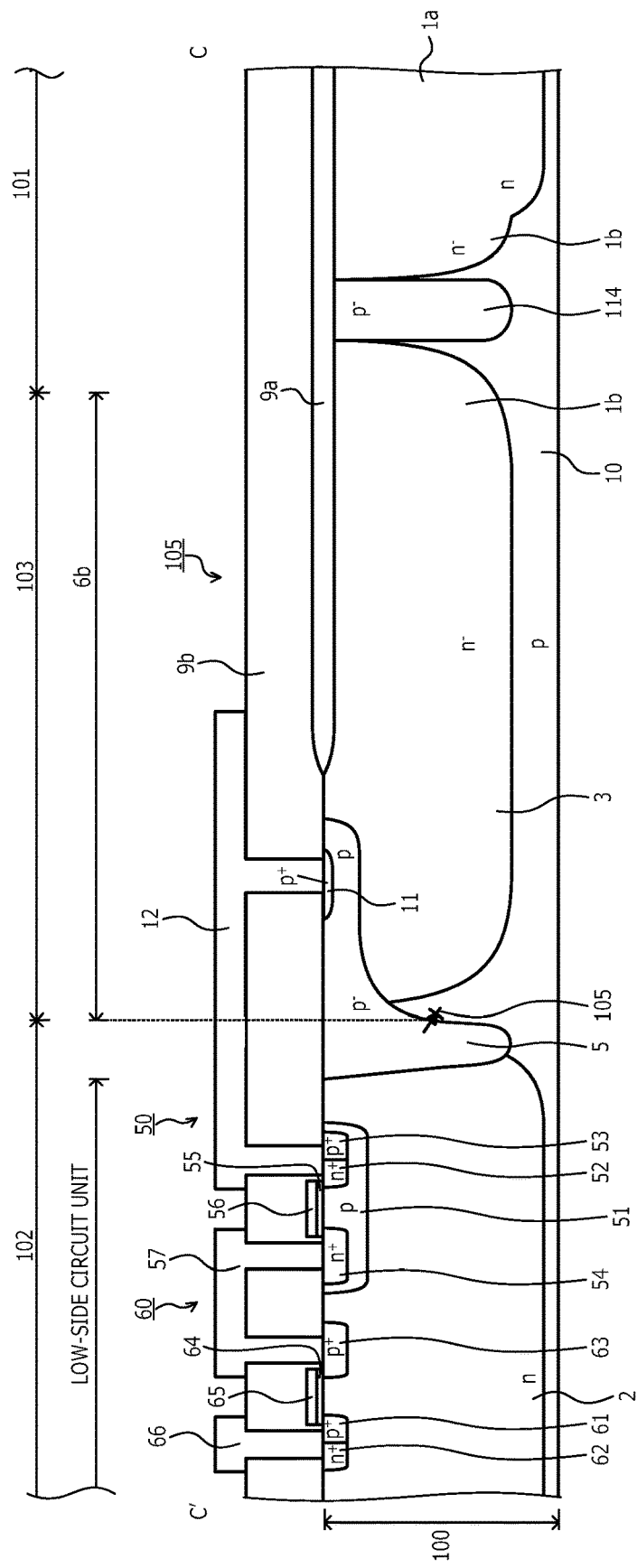
FIG. 12 is a cross-sectional view of a structure of a semiconductor device according to a ninth embodiment.

A structure of a semiconductor device according to a ninth embodiment will be described. FIG. 12 is a cross-sectional view of the structure of the semiconductor device according to the ninth embodiment. The ninth embodiment is a modification example of the first embodiment. FIG. 12 depicts the cross-sectional structure taken along the cutting-plane line C-C' of FIG. 1, i.e., the cross-sectional structure of the diode region 6b of the first HVJT portion 6. The semiconductor device according to the ninth embodiment differs from the semiconductor device according to the first embodiment in that the p⁻-type separation region 114 made up of a diffusion region is formed in a portion of the p-type semiconductor substrate 100 remaining in a slit shape exposed on the substrate front surface from the p-type region 10 on the substrate rear surface side. The p⁻-type separation region 114 may be formed at the same ion implantation step as the second p⁻-type separation region 5, for example.

The configuration of the semiconductor device according to the ninth embodiment may be applied to the semiconductor devices according to the second to sixth embodiments.

As described above, according to the ninth embodiment, even when the p⁻-type separation region electrically separating the high potential side region and the HVJT is made up of a diffusion region, effects similar to those of the first to sixth embodiments may be obtained.

Figure 13:
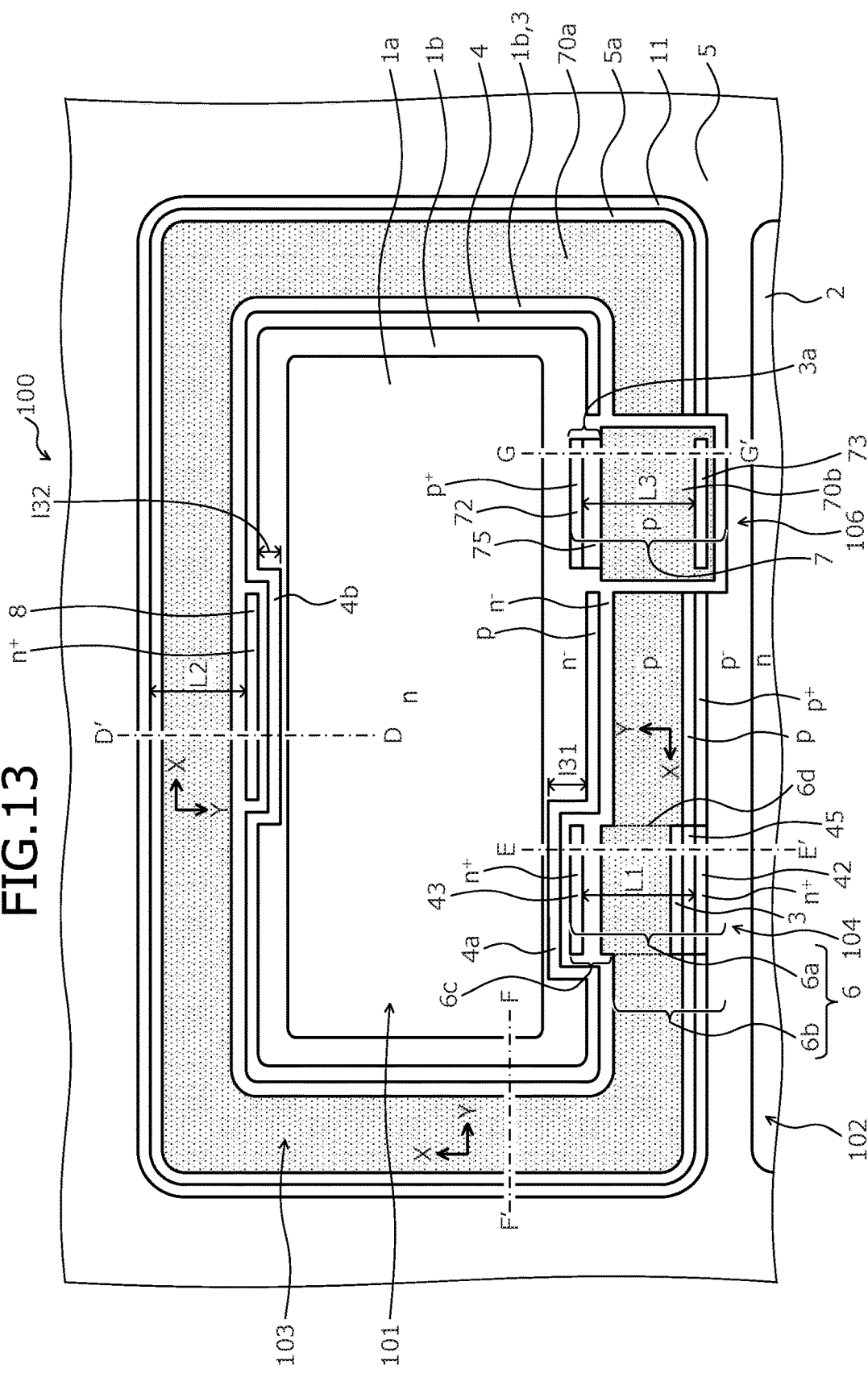
FIG. 13 is a plan view of a planar layout of a semiconductor device according to a tenth embodiment.
Figure 14:
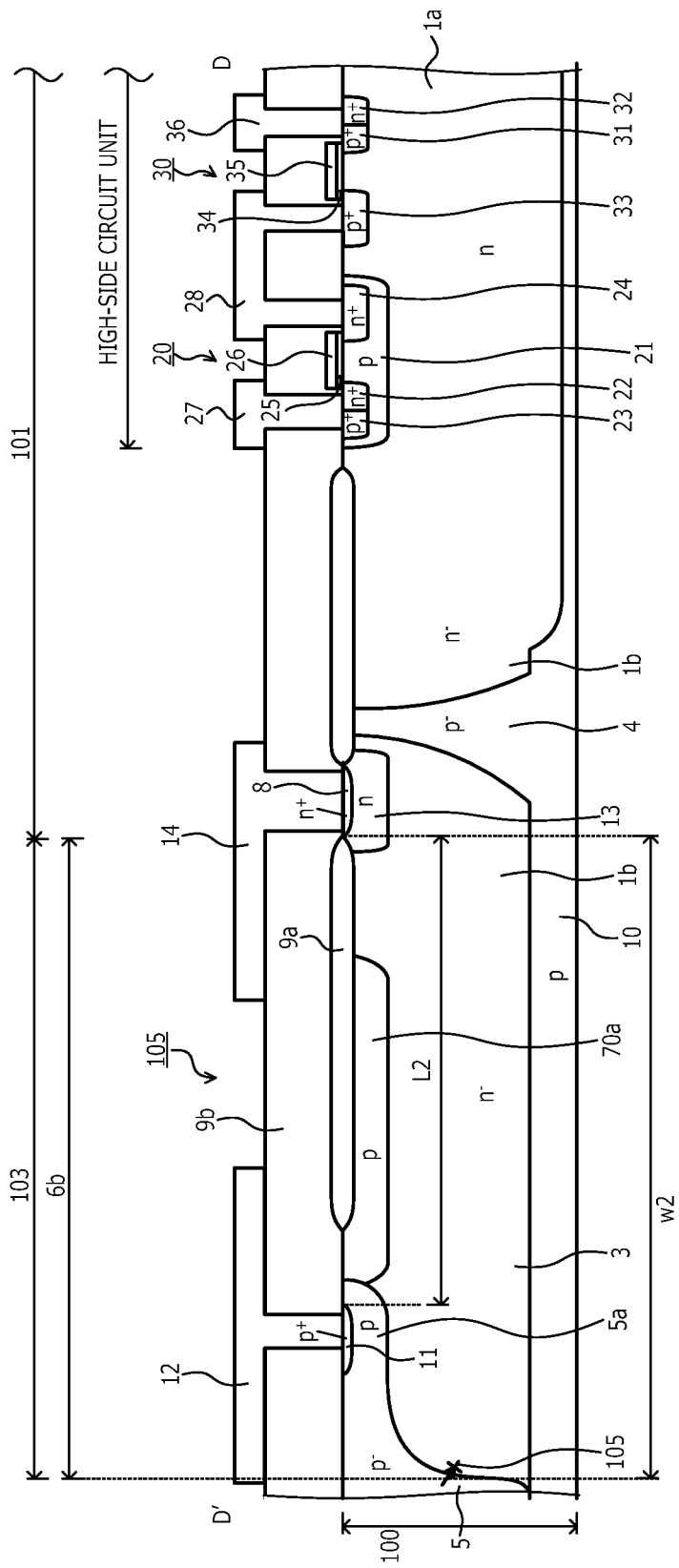
FIG. 14 is a cross-sectional view taken along a cutting-plane line D-D' of FIG. 13.
Figure 15:
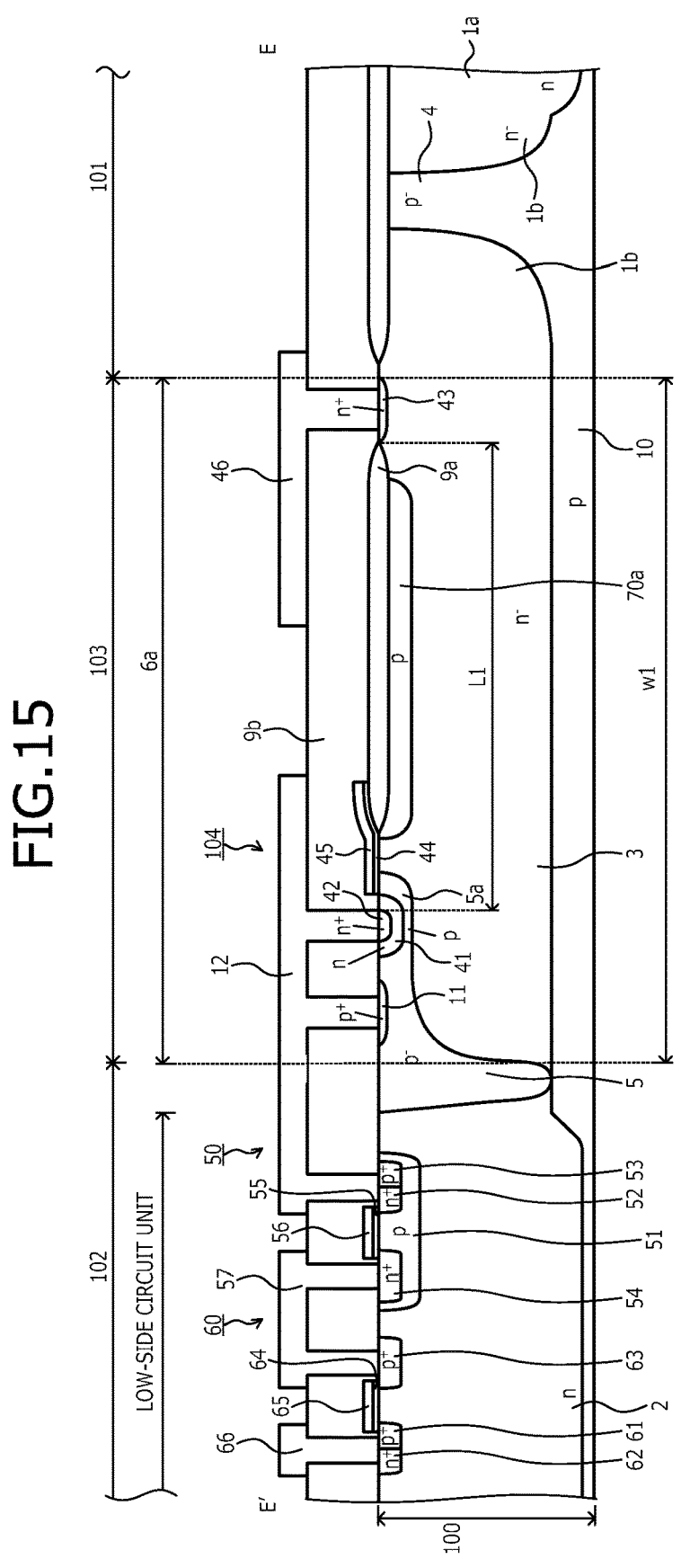
Figure 16:
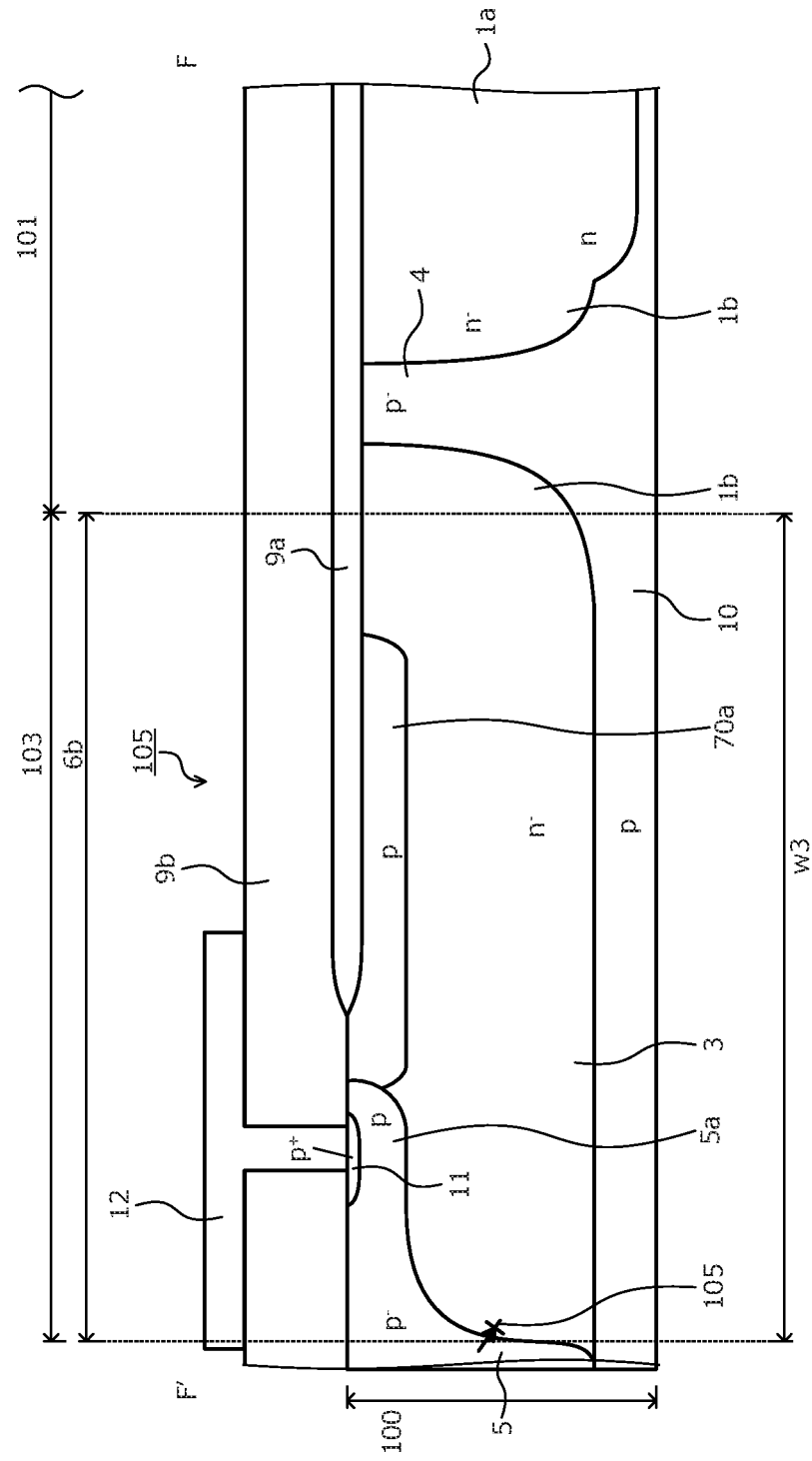
FIG. 16 is a cross-sectional view taken along a cutting-plane line F-F' of FIG. 13.
Figure 17:
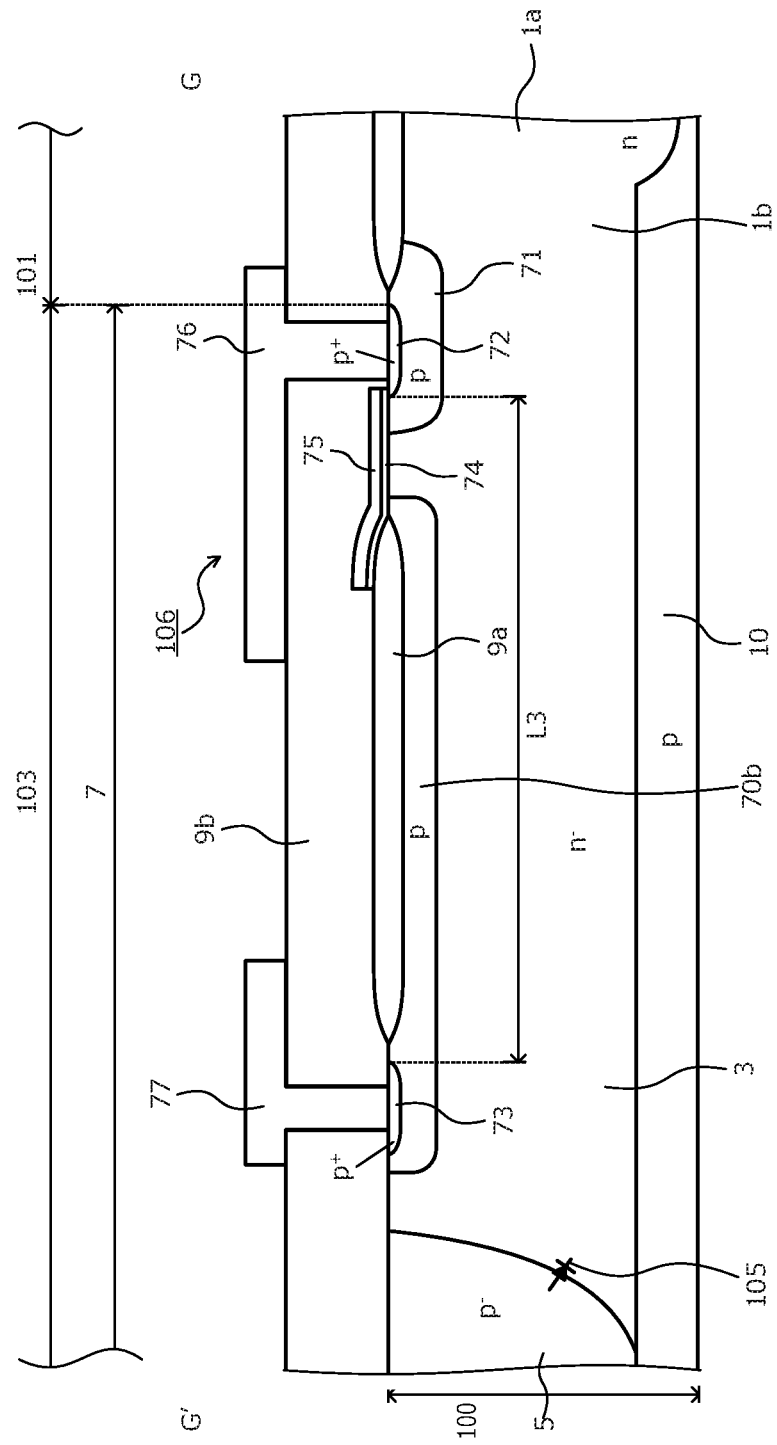
FIG. 17 is a cross-sectional view taken along a cutting-plane line G-G' of FIG. 13.

A structure of a semiconductor device according to a tenth embodiment will be described. FIG. 13 is a plan view of a planar layout of the semiconductor device according to the tenth embodiment. FIG. 14 is a cross-sectional view taken along a cutting-plane line D-D' of FIG. 13. FIG. 15 is a cross-sectional view taken along a cutting-plane line E-E' of FIG. 13. FIG. 16 is a cross-sectional view taken along a cutting-plane line F-F' of FIG. 13. FIG. 17 is a cross-sectional view taken along a cutting-plane line G-G' of FIG. 13. For example, FIGS. 14 and 16 depict the cross-sectional structure of the parasitic diode 105 of the HVJT 103, and FIG. 15 depicts the cross-sectional structure of the nchMOSFET 104. FIG. 17 depicts the cross-sectional structure of a pchMOSFET 106 of the second HVJT portion 7.

In the configuration of the semiconductor device according to the tenth embodiment, the double RESURF structure is applied to the HVJT 103 of the semiconductor device according to the first embodiment (see FIGS. 1 to 4) and the pchMOSFET 106 of the level-down level shift circuit is arranged in the second HVJT portion 7. For example, as depicted in FIG. 13, p-type diffusion regions (hereinafter referred to as p-type RESURF regions) 70a, 70b constituting the double RESURF structure are arranged in the n⁻-type diffusion region 3 of the HVJT 103. In FIG. 13, the p-type RESURF regions 70a, 70b are arranged in a planar layout surrounding the periphery of the n⁻-type diffusion region 1b as indicated by hatching (similarly in FIG. 18). The p-type RESURF region 70a is arranged in a substantially U-shaped or substantially C-shaped planar layout surrounding the periphery of the n⁻-type diffusion region 1b in the first HVJT portion 6. For example, the p-type RESURF region 70a may be arranged to extend in a concave portion (hereinafter referred to as a first concave portion) 4a of the first p⁻-type separation region 4 curved inwardly in a concave shape along the nchMOS region 6a, in a planar layout protruding in a convex shape along the first concave portion 4a.

The n⁺-type region 8 also serving as the cathode contact region of the parasitic diode 105 of the HVJT 103 may be arranged in the diode region 6b. In this case, a portion 4b of the first p⁻-type separation region 4 may be arranged in a planar layout curved inwardly in a concave shape, and the n⁺-type region 8 may be arranged at a position substantially surrounded by a concave portion (hereinafter referred to as a second concave portion) 4b of the first p⁻-type separation region 4. A protrusion width 132 in the radial direction Y of the second concave portion 4b of the first p⁻-type separation region 4 is shorter than a protrusion width 131 in the radial direction Y of the concave portion (hereinafter referred to as the first concave portion) 4a of the first p⁻-type separation region 4 curved inwardly in a concave shape along the nchMOS region 6a (131>132). As a result, similar to the first embodiment, the high-concentration inter-region distance L1 of the nchMOSFET 104 of the level-up level shift circuit is longer than the high-concentration inter-region distance L2 of the parasitic diode 105 of the HVJT 103.

The p-type RESURF region (ninth semiconductor region) 70b is arranged in a substantially rectangular planar layout almost over the entire n⁻-type diffusion region 3 in the second HVJT portion 7. The p-type RESURF region 70b is separated from the p-type RESURF region 70a by the n⁻-type diffusion region 3. The p-type RESURF region 70b also serves as the p-type drift region of the pchMOSFET 106 of the level-down level shift circuit. The n⁻-type diffusion region 3 is arranged in a planar layout where a portion in which the pchMOSFET 106 is arranged in the second HVJT portion 7 protrudes inwardly in a convex shape relative to the first p⁻-type separation region 4. The p-type RESURF region 70b extends inwardly within a range not reaching a p-type offset region 71 (a p⁺-type source region 72 if the p-type offset region 71 is not provided) and reaches an end portion 3a of the n⁻-type diffusion region 3 protruded in a convex shape in the second HVJT portion 7.

For example, the p-type RESURF region 70b is extended inwardly relative to the p-type RESURF region 70a in the diode region 6b. The p⁺-type source region (a tenth semiconductor region) 72 of the pchMOSFET 106 is arranged farther inward than the first p⁻-type separation region 4. For example, the p⁺-type source region 72 of the pchMOSFET 106 may be arranged at about a same position as the position of the n⁺-type drain region 43 of the nchMOSFET 104 in the radial direction Y, for example. In this way, a high-concentration inter-region distance L3 of the pchMOSFET 106 is longer than the high-concentration inter-region distance L2 of the parasitic diode 105 of the HVJT 103 (L3>L2). The high-concentration inter-region distance L3 of the pchMOSFET 106 is the length (width) in the radial direction Y between the p⁺-type source region 72 of the pchMOSFET 106 and a p⁺-type drain region (eleventh semiconductor region) 73.

The high-concentration inter-region distance L3 of the pchMOSFET 106 is one of the factors determining the drift length of the pchMOSFET 106 and when the high-concentration inter-region distance L3 of the pchMOSFET 106 is longer, the drift length of the pchMOSFET 106 becomes longer. Therefore, the drift length of the pchMOSFET 106 is longer than the drift length of the parasitic diode 105 of the HVJT 103.

As depicted in FIGS. 14 to 17, these p-type RESURF regions 70a, 70b are each selectively provided in the surface layer of the n⁻-type diffusion region 3 on the substrate front surface side. For example, in the nchMOS region 6a, the p-type RESURF region 70a is arranged between the inner portion 5a of the second p⁻-type separation region 5 and the n⁺-type drain region 43 of the nchMOSFET 104, away from the inner portion 5a of the second p⁻-type separation region 5 and the n⁺-type drain region 43 (FIG. 15). In the diode region 6b, the p-type RESURF region 70a is arranged between the inner portion 5a of the second p⁻-type separation region 5 (the anode region of the parasitic diode 105 of the HVJT 103) and the n⁺-type region 8 (the cathode contact region of the parasitic diode 105 of the HVJT 103), in contact with the inner portion 5a of the second p⁻-type separation region 5 and separate from the n⁺-type region 8 (FIGS. 14 and 16).

When the n-type offset region 13 (not depicted in FIG. 13 and FIG. 18 described later) is provided between the n⁺-type region 8 and the n⁻-type diffusion region 3, the p-type RESURF region 70a is arranged separated from the n-type offset region 13. The inner portion 5a of the second p⁻-type separation region 5 may further be extended inwardly and may be used as the p-type RESURF region 70a. In the second HVJT portion 7, the p-type RESURF region 70b is arranged between the inner portion 5a of the second p⁻-type separation region 5 and the p⁺-type source region 72 of the pchMOSFET 106 separated from the second p⁻-type separation region 5 and the p⁺-type source region 72 (FIG. 17). The p-type RESURF regions 70a, 70b are covered by the LOCOS film 9a and the interlayer insulating film 9b. The double RESURF structure is made up of the p-type region 10 and the n⁻-type diffusion region 3, as well as the n⁻-type diffusion region 3 and the p-type RESURF regions 70a, 70b.

The cross-sectional structure (FIGS. 14 and 16) of the parasitic diode 105 of the HVJT 103 other than the double RESURF structure achieved by providing the p-type RESURF region 70a is similar to the parasitic diode of the HVJT of the first embodiment (see FIGS. 2 and 4). The cross-sectional structure (FIG. 15) of the nchMOSFET 104 other than the double RESURF structure achieved by providing the p-type RESURF region 70a is similar to the nchMOSFET of the level-up level shift circuit of the first embodiment (see FIG. 3). The cross-sectional structures (FIGS. 14 and 15) of the high-side circuit unit of the high potential side region 101 and the low-side circuit unit of the low potential side region 102 are similar to those in the high-side circuit unit and the low-side circuit unit, respectively, of the first embodiment (see FIGS. 2 and 4). The cross-sectional structure of the pchMOSFET 106 is depicted in FIG. 17.

As depicted in FIG. 17, the pchMOSFET 106 includes a planar gate type MOS gate structure made up of the p-type RESURF region 70b, the p⁺-type source region 72, the p⁺-type drain region 73, a gate insulating film (second gate insulating film) 74, and a gate electrode (second gate electrode) 75. The p⁺-type source region 72 is provided farther inward than the p-type RESURF region 70b in the n⁻-type diffusion regions 1b, 3, separated from the p-type RESURF region 70b. The p-type offset region 71 may be provided between the n⁻-type diffusion region 3 and the p⁺-type source region 72, separately from the p-type RESURF region 70b and covering the p⁺-type source region 72. The p⁺-type drain region 73 is selectively arranged in the p-type RESURF region 70b, as far as possible in an outer periphery of the p-type RESURF region 70b. The p⁺-type drain region 73 and the p-type RESURF region 70b are electrically separated from the second p⁻-type separation region 5 by the n⁻-type diffusion region 3.

The LOCOS film 9a is provided on the surface of the n⁻-type diffusion region 3 between the p⁺-type source region 72 and the p⁺-type drain region 73. The gate electrode 75 is provided via the gate insulating film 74 on a surface of a portion of the n⁻-type diffusion region 3 interposed between the p-type RESURF region 70b and the p-type offset region 71 (the p⁺-type source region 72 when the p-type offset region 71 is not provided). The gate electrode 75 may extend over the LOCOS film 9a selectively covering the p-type RESURF region 70b. A source electrode (fourth electrode) 76 electrically contacts the p⁺-type source region 72. As described above, the first p⁻-type separation region 4 may be omitted in the second HVJT portion 7. The source electrode 76 is fixed at the high-side power-supply potential H-VDD. The drain electrode (fifth electrode) 77 is in contact with the p⁺-type drain region 73 and is electrically insulated from the GND electrode 12 by the interlayer insulating film 9b.

In the description of the semiconductor device according to the tenth embodiment, the MOSFETs used as the level shift circuits are respectively arranged in the first and second HVJT portions 6, 7; however, configuration may be such that the MOSFET used as the level shift circuit may be arranged in only one of the first and second HVJT portions 6, 7. Alternatively, the p-type RESURF region 70b may be provided only in the second HVJT portion 7 so that only the second HVJT portion 7 has the double RESURF structure. In this case, the nchMOSFET 104 may be omitted in the first HVJT portion 6 of the single RESURF structure. Alternatively, the p-type RESURF region 70a may be provided only in the first HVJT portion 6 so that only the first HVJT portion 6 has the double RESURF structure. In this case, the MOSFET (the nchMOSFET 104) used as the level shift circuit is arranged only in the first HVJT portion 6.

Figure 18:
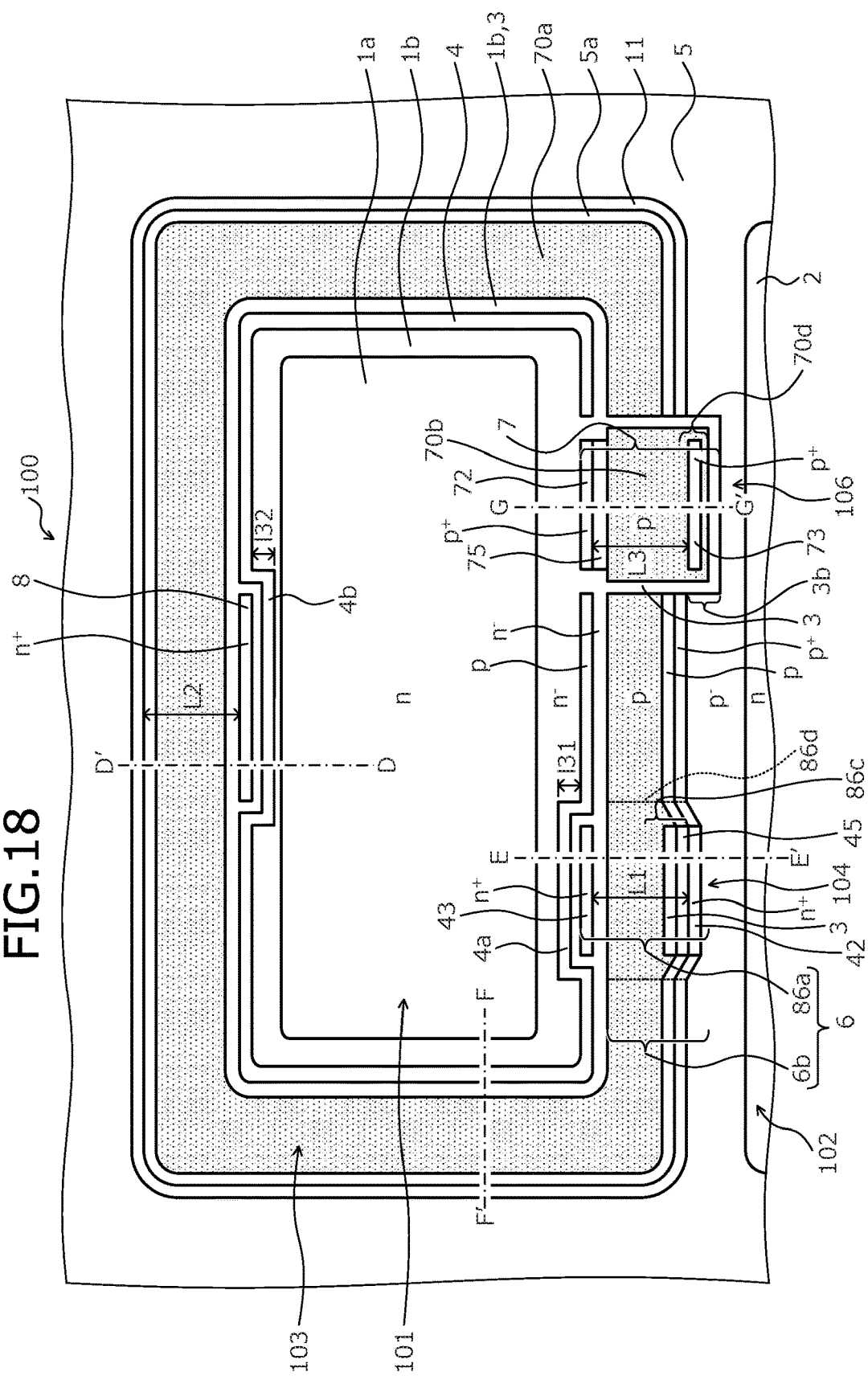
FIG. 18 is a plan view of another example of the planar layout of the semiconductor device according to the tenth embodiment.

Similar effects may be obtained also when the tenth embodiment is applied to the semiconductor devices according to the first to ninth embodiments. For example, FIG. 18 depicts an example of a planar layout when the tenth embodiment is applied to the semiconductor device according to the fourth embodiment (see FIGS. 7A and 7B). FIG. 18 is a plan view of another example of the planar layout of the semiconductor device according to the tenth embodiment. The example of the semiconductor device according to the tenth embodiment depicted in FIG. 18 differs from the semiconductor device according to the fourth embodiment on the following three points. The first difference is that the pchMOSFET 106 of the level-down level shift circuit is arranged in the second HVJT portion 7. The second difference is that the n$^-$-type region 8 is arranged in the first HVJT portion 6. The third difference is that the p-type RESURF regions 70a, 70b are respectively provided in the first and second HVJTs 6, 7 to achieve the double RESURF structure.

As depicted in FIG. 18, the p-type RESURF region 70a is arranged in a planar layout protruding outwardly in a convex shape along an outwardly-protruding end portion 86c of the nchMOS region 86a. The p-type RESURF region 70b is arranged away from the second p$^-$-type separation region 5 and reaches an end portion 3b of the n$^-$-type diffusion region 3 protruding outwardly in a convex shape in the second HVJT portion 7. The p$^+$-type drain region 73 is arranged in an outward portion of the p-type RESURF region 70b as far as possible. For example, the p$^+$-type drain region 73 is arranged, for example, in an end portion 70d of the p-type RESURF region 70b protruding outwardly in a convex shape. The protrusion width 131 in the radial direction Y of the first concave portion 4a of the first p$^-$-type separation region 4 may be about the same as the protrusion width 132 in the radial direction Y of the second concave portion 4b of the first p$^-$-type separation region 4 (131=132).

As described above, according to the tenth embodiment, even when the HVJT has the double RESURF structure, the high-concentration inter-region distance of the nchMOSFET in the nchMOS region may be made longer than the high-concentration inter-region distance of the parasitic diode of the HVJT. As a result, the drift length of the nchMOSFET in the nchMOS region may be made longer than the drift length of the parasitic diode of the HVJT. Therefore, even when surge voltage such as ESD is input during the OFF state and avalanche breakdown occurs in the nchMOSFET in the nchMOS region and the parasitic diode of the HVJT at the same time, the avalanche current mainly flows through the diode region. Thus, similar to the first embodiment, the avalanche current causing the parasitic operation in the nchMOSFET in the nchMOS region may be suppressed from flowing into the nchMOSFET in the nchMOS region. As a result, the surge resistance of the overall semiconductor device may be improved.

According to the tenth embodiment, by arranging the n$^-$-type diffusion region (voltage withstand region) in a planar layout protruding inwardly or outwardly in a convex shape in the region in which the pchMOSFET of the HVJT is arranged, the high-concentration inter-region distance of the pchMOSFET may be made longer than the high-concentration inter-region distance of the parasitic diode of the HVJT. Therefore, the drift length of the pchMOSFET of the HVJT may be made longer than the drift length of the parasitic diode of the HVJT. As a result, the electric field applied to the drift region of the pchMOSFET in the pchMOS region may be mitigated, and the off-state breakdown voltage of the pchMOSFET of the HVJT may be made higher than the off-state breakdown voltage of the parasitic diode of the HVJT. Therefore, when avalanche breakdown occurs during the OFF state in the pchMOSFET of the HVJT and the parasitic diode of the HVJT at the same time, the avalanche current mainly flows through the diode region of the HVJT (the region other than the region in which the nchMOSFET and the pchMOSFET are arranged). Thus, the avalanche current causing the parasitic operation in the pchMOSFET of the HVJT may be suppressed from flowing into the pchMOSFET. Therefore, even when the pch MOSFET is arranged in HVJT, the surge resistance of the overall semiconductor device may be improved.

According to the tenth embodiment, the electric field applied to the drift region of the pchMOSFET of the HVJT may be mitigated and therefore, an occurrence of an impact ion phenomenon at the end portion of the drift region of the pchMOSFET may be suppressed. Therefore, the on-state breakdown voltage may be improved also in the pchMOSFET. According to the tenth embodiment, it is not necessary to increase the drift length of the parasitic diode of the HVJT according to the drift length of the nchMOSFET or the pchMOSFET of the HVJT. Therefore, increases in the chip area may be minimized. Thus, the reliability may be improved by enhancing both the on-state breakdown voltage and the off-state breakdown voltage of the nchMOSFET and the pchMOSFET of the HVJT, and the chip size may be reduced. According to the tenth embodiment, the avalanche current flowing into the nchMOSFET and the pchMOSFET of the HVJT may be suppressed by the arrangement of the nchMOS region and the second HVJT portion alone. Therefore, as compared to the structure in which the avalanche current flowing into the nchMOSFET and the pchMOSFET of the HVJT is suppressed by the level shift resistor alone, the degree of freedom in design is high.

Figure 19:
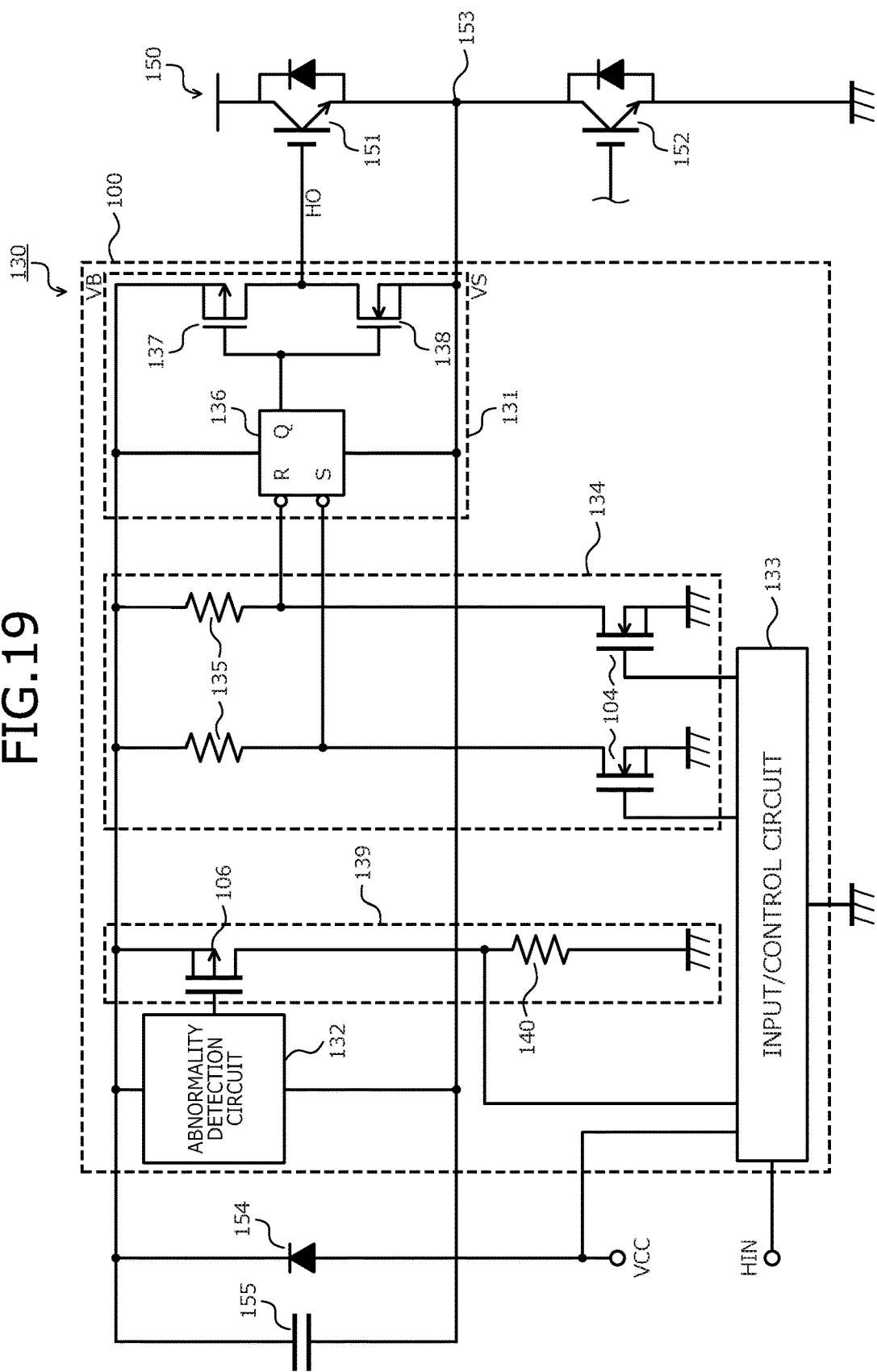
FIG. 19 is a circuit diagram of a circuit configuration of a semiconductor device according to an eleventh embodiment.
Figure 20:
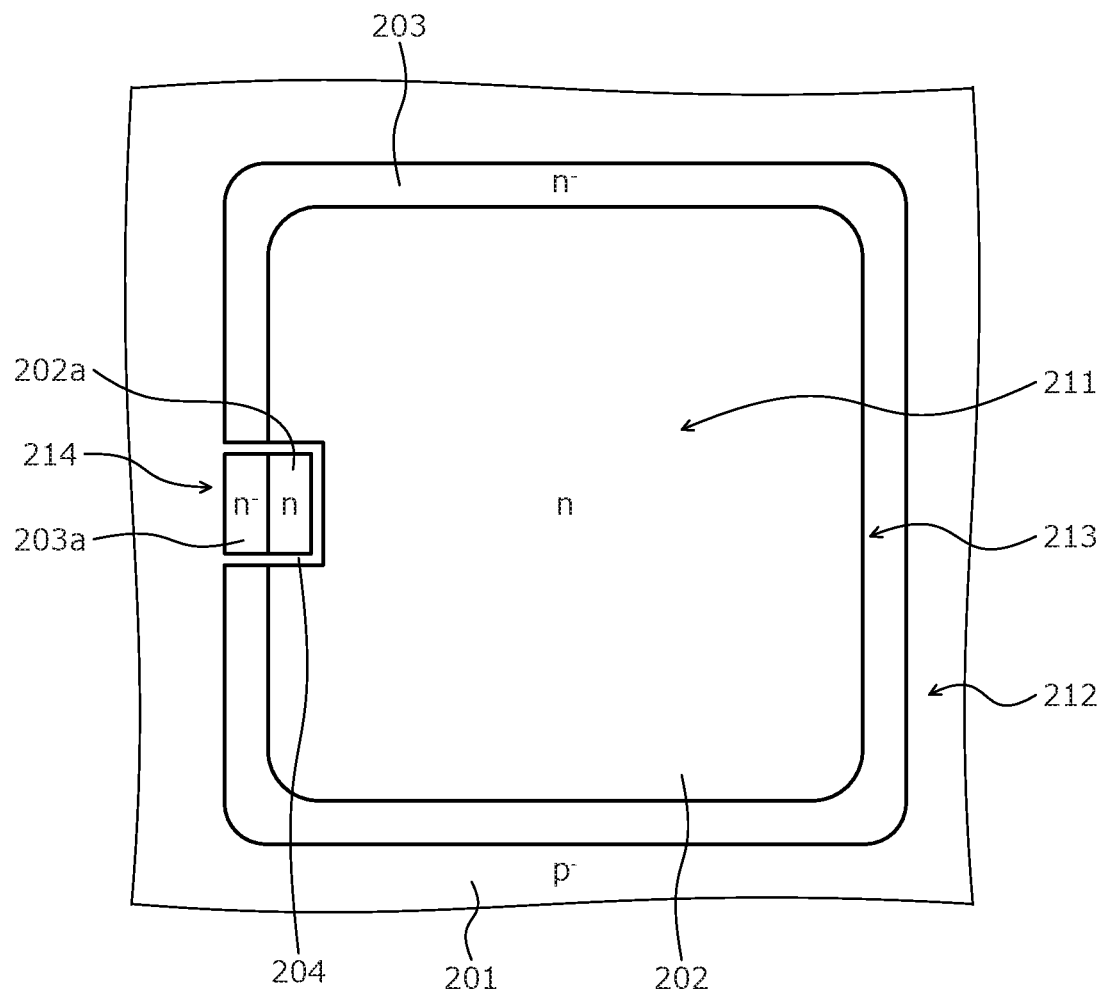
FIGS. 20, 21, 22, 23, and 24 are plan views of examples of planar layouts of main parts of conventional semiconductor devices.
Figure 21:
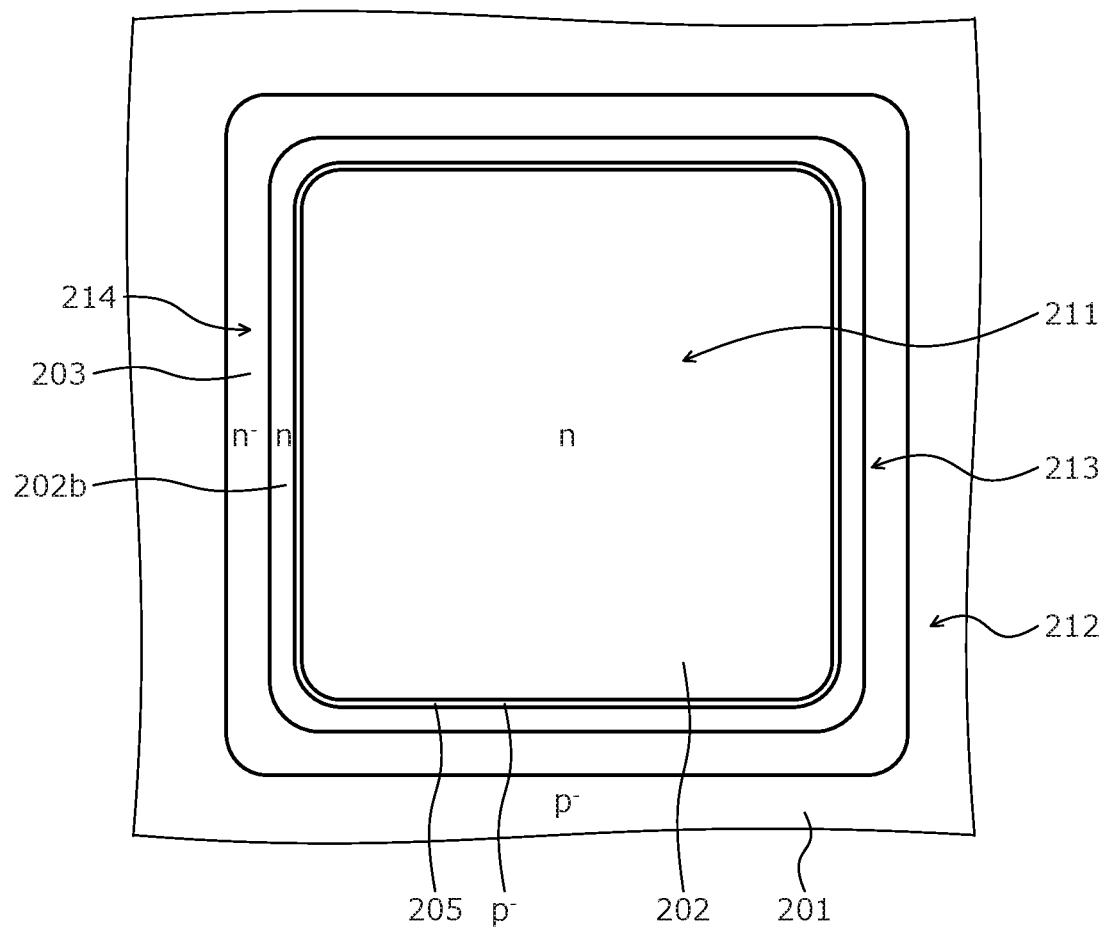
Figure 22:
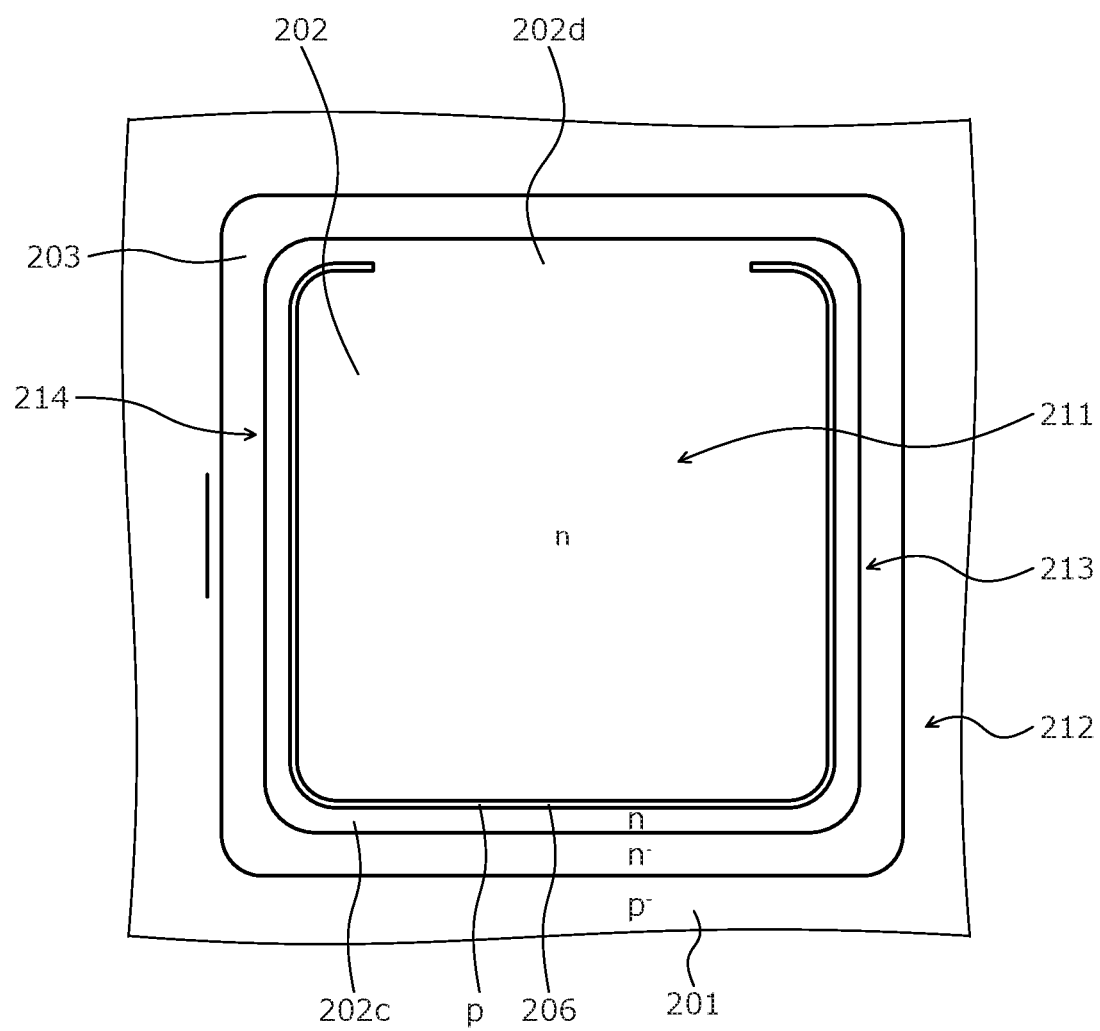
Figure 23:
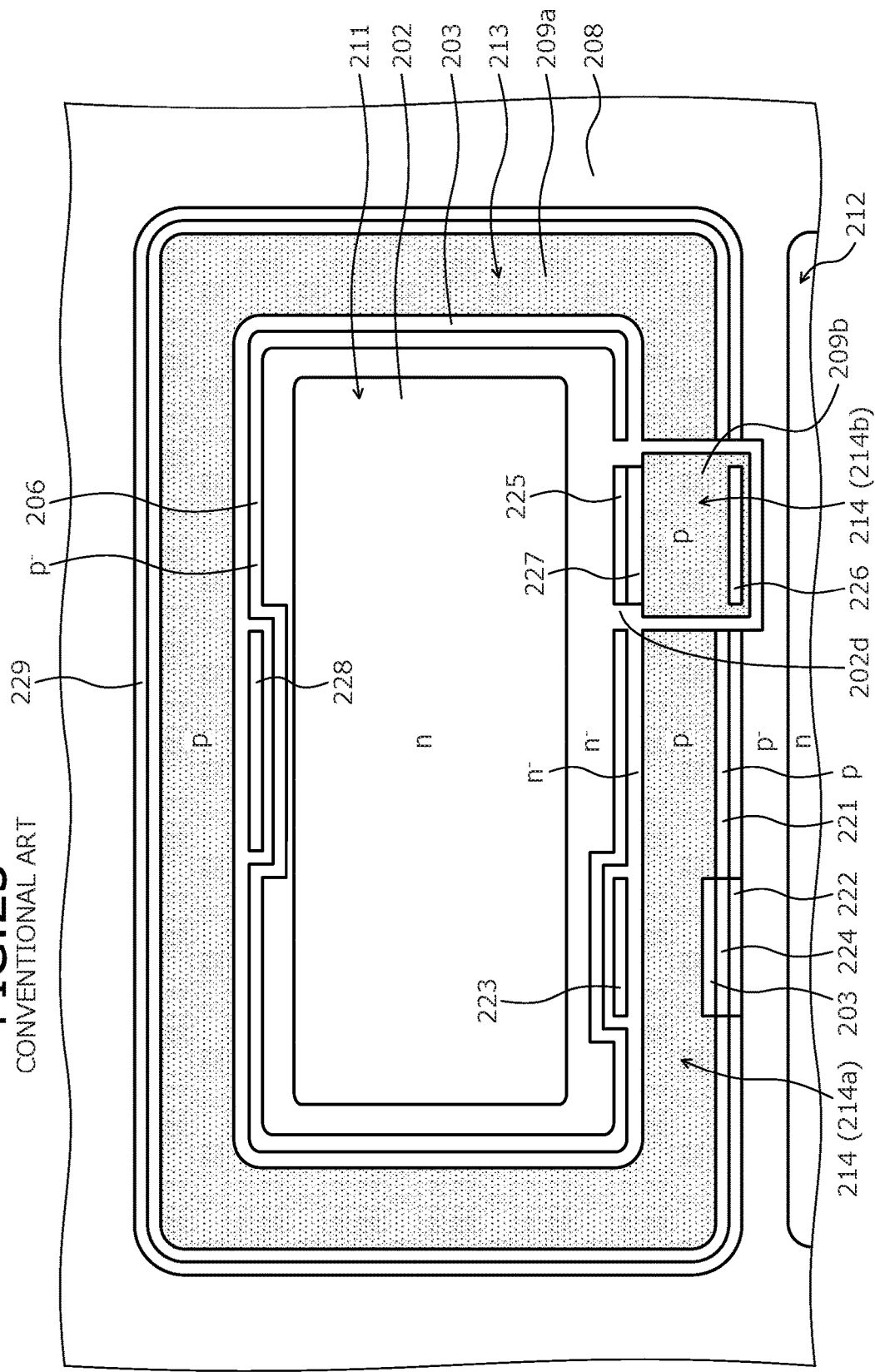
Figure 24:
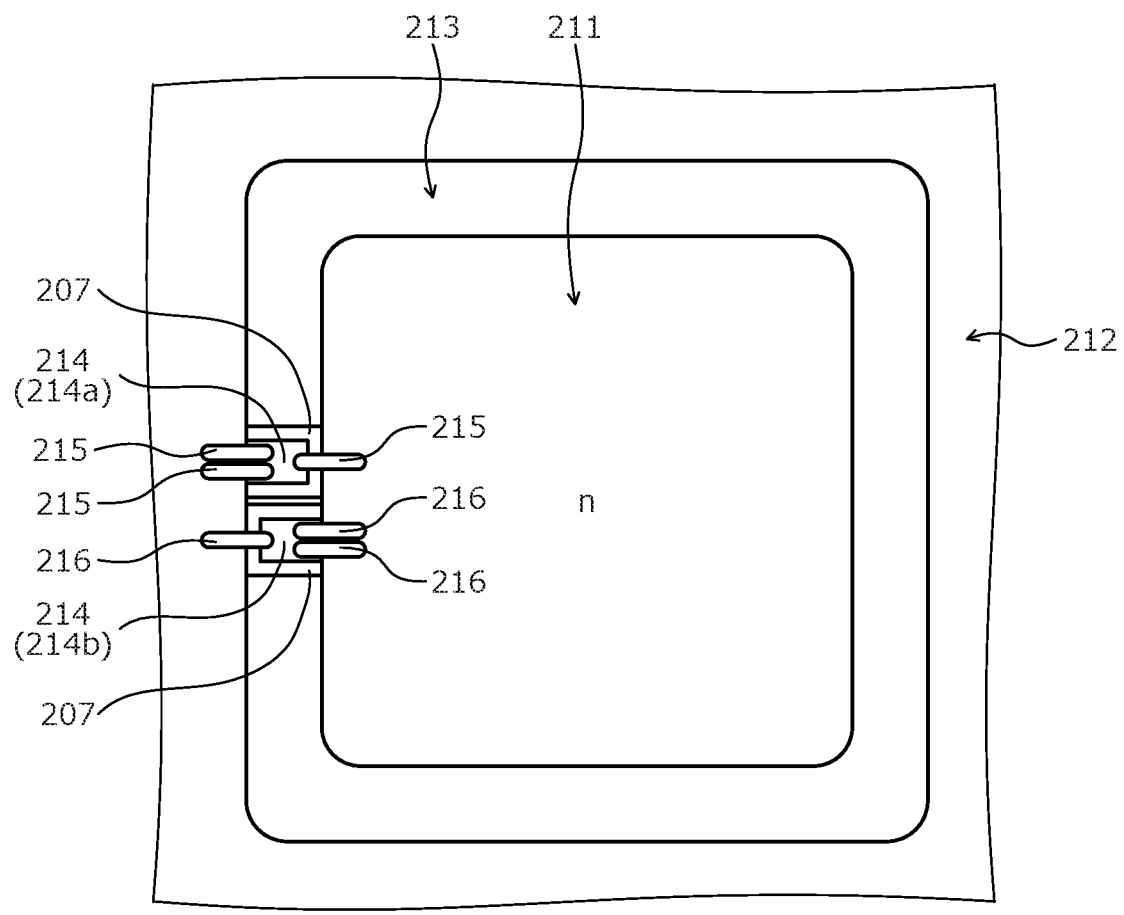

A semiconductor device according to an eleventh embodiment will be described in terms of an example of a circuit configuration to which the semiconductor devices according to the first to tenth embodiments are applied. FIG. 19 is a circuit diagram of a circuit configuration of the semiconductor device according to the eleventh embodiment. For example, an HVIC 130 described as an example is connected to a power conversion bridge circuit 150 and drives a first IGBT 151 on the high side between series-connected first and second IGBTs 151, 152 constituting one phase of the power conversion bridge circuit 150. On a single semiconductor chip (the p-type semiconductor substrate 100), the HVIC 130 depicted in FIG. 19 includes a high-side gate drive circuit 131, an abnormality detection circuit 132, an input/control circuit 133, a level-up level shift circuit 134, a level-down level shift circuit 139, and the HVJT 103. The two series-connected IGBTs 151, 152 are connected between high-voltage power supplies. The power supply voltage of the high-voltage power supplies is 100 V or higher.

The high-side gate drive circuit 131 and the abnormality detection circuit 132 are arranged in the high potential side region 101 and operate at a power supply voltage VCC by using an emitter potential VS of the first IGBT 151 on the high side of the power conversion bridge circuit 150 as a reference potential and a power-supply potential VB as the highest potential (the high-side power-supply potential H-VDD). The emitter potential VS of the first IGBT 151 is a potential at a connection point 153 between the first IGBT 151 and the second IGBT 152 on the low side. The high potential side region 101 is a high potential region having a floating potential electrically separated from the low potential side region 102 by the HVJT 103. The abnormality detection circuit 132 transmits an abnormality detection signal to the input/control circuit 133. Reference numerals 154, 155 are a bootstrap diode and a bootstrap capacitor, respectively. A voltage charged from the power supply voltage VCC via the bootstrap diode 154 into the bootstrap capacitor 155 serves as a high side power supply. The power-supply potential VB is the sum of the emitter potential VS of the first IGBT 151 on the high side of the power conversion bridge circuit 150 and the high side power supply. The power supply voltage VCC and the high side power supply voltage are 30 V, for example.

The input/control circuit 133 is arranged in the low potential side region 102 and operates based on the ground potential GND. The input/control circuit 133 operates at the power supply voltage VCC supplied from a power supply voltage terminal and controls an output HO of the high-side gate drive circuit 131 based on a control signal HIN from an external source (a microcomputer, etc.) and the abnormality detection signal from the abnormality detection circuit 132. The high-side gate drive circuit 131 corresponds to the high-side circuit unit of the first to tenth embodiments. The level-up level shift circuit 134 is made up of two level shift circuits for a set signal and a reset signal. The level shift circuit is made up of the high-voltage nchMOSFET 104 and a level shift resistor 135. This nchMOSFET 104 corresponds to the nchMOSFET arranged in the nchMOS region of the HVJT 103 of the first to tenth embodiments.

The level shift resistor 135 constituting the level-up level shift circuit 134 is arranged in the high potential side region 101 (the n-type diffusion region 1a or the n⁻-type diffusion region 1b). The level-up level shift circuit 134 converts the set signal and the reset signal based on the ground potential GND input from the input/control circuit 133 into a signal based on the power-supply potential VB, and inputs the signal to a latch circuit 136 downstream. The set signal is a signal for turning on the high-side gate drive circuit 131 to output the output HO of the high-side gate drive circuit 131 as the gate signal of the first IGBT 151 on the high side of the power conversion bridge circuit 150. The reset signal is a signal for turning off the high-side gate drive circuit 131. The output terminal Q of the latch circuit 136 is connected to gates of a pchMOSFET 137 for gate charge and an nchMOSFET 138 for gate discharge of the first IGBT 151 on the high side of the power conversion bridge circuit 150.

The gate of the first IGBT 151 on the high side of the power conversion bridge circuit 150 is connected to a connection point between the sources of the pchMOSFET 137 and the nchMOSFET 138. The level-down level shift circuit 139 is made up of the high-voltage pchMOSFET 106 and the level shift resistor 140. This pchMOSFET 106 corresponds to the pchMOSFET arranged in the HVJT 103 of the first embodiment. The level shift resistor 140 of the level-down level shift circuit 139 is arranged in the low potential side region 102. The level-down level shift circuit 139 converts the abnormality detection signal based on the power-supply potential VB output from the abnormality detection circuit 132 into a signal based on the ground potential GND and transmits the signal to the input/control circuit 133.

As described above, the eleventh embodiment produces effects similar to those of the first to tenth embodiments.

In the above description, the present invention is not limited to the embodiments described above and may variously be modified without departing from the spirit of the present invention. For example, the high potential side region 101 (the n-type diffusion regions 1a, 1b) and the HVJT 103 (the n⁻-type diffusion region 3) may be completely electrically separated by the p⁻-type separation region without providing the second HVJT portion 7. In particular, the p⁻-type separation region may be arranged in a substantially rectangular frame-shaped planar layout in which a portion facing the inner side of the nchMOS region 6a is curved inwardly in a concave shape in the first and third embodiments described above, and the p⁻-type separation region may be arranged in a substantially rectangular frame-shaped planar layout in the second and fourth embodiment described above.

Conversely, the present invention may be configured such that the first HVJT portion 6 is not provided, i.e., the p⁻-type separation region is not provided between the high potential side region 101 and the HVJT 103. In this case, the n⁻-type diffusion region 1b is longer so as to ensure the distance L100 sufficiently separating the n⁺-type drain region 43 of the nchMOSFET 104 constituting a level shifter from the n⁺-type region 8 functioning as the cathode contact region of the parasitic diode 105 of the HVJT 103 and the n-type diffusion region 1a. When the n⁻-type diffusion region 1b creating the distance L100 is used as the level shift resistor connected to the n⁺-type drain region 43 of the nchMOSFET 104, the n⁻-type diffusion region 1b may be formed under conditions resulting in a resistance value usable as a level shift resistor. When the n⁻-type diffusion region 1b creating the distance L100 is not used as the level shift resistor connected to the n⁺-type drain region 43 of the nchMOSFET 104, the n⁻-type diffusion region 1b may be formed under conditions making the parasitic resistance larger than the resistance value of the level shift resistor.

In the first to ninth embodiments described above, the n⁻-type diffusion region 3 or the n⁻-type epilayer 123 is partly increased in width and arranged in a planar layout protruding in a convex shape; however, configuration may be such that the n⁻-type diffusion region 3 and the n⁻-type epilayer 123 are not changed in width and do not form a portion protruded in a convex shape. In this case, the n⁺-type drain region 43 of the nchMOSFET 104 and the n⁺-type region 8 constituting the level shifter may be arranged such that the high-concentration inter-region distance L1 of the nchMOSFET 104 becomes longer than the high-concentration inter-region distance L2 of the parasitic diode 105 of the HVJT 103.

Multiple constituent units each including the high potential side region 101, the low potential side region 102, and the HVJT 103 described above may be arranged on a single semiconductor chip. In the first to ninth embodiments described above, similar to the tenth embodiment, the n⁺-type region 8 also serving as the cathode contact region of the parasitic diode 105 of the HVJT 103 may be arranged in the first HVJT portion 6. A trench filled with an insulating layer may be arranged instead of the p⁻-type separation region to electrically separate the high potential side region 101 and the HVJT 103 as well as the HVJT 103 and the low potential side region 102.

The semiconductor device according to the present invention produces an effect in that reliability may be improved.

As described, the semiconductor device according to the present invention is useful for, for example, high-voltage integrated circuit devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a first semiconductor region of a second conductivity type selectively provided on a semiconductor substrate of a first conductivity-type;
   a second semiconductor region of the second conductivity type surrounding a periphery of the first semiconductor region;
   a third semiconductor region of the first conductivity type provided outside of the second semiconductor region;
   a fourth semiconductor region of the second conductivity type selectively provided in the third semiconductor region;
   a fifth semiconductor region of the second conductivity type selectively provided in one of the first semiconductor region and the second semiconductor region, an impurity concentration of the fifth semiconductor region being higher than that of the second semiconductor region;
   a first gate electrode provided on a surface of a portion of the third semiconductor region between the fourth semiconductor region and the second semiconductor region, the first gate electrode provided via a first gate insulating film;
   a first electrode contacting the third semiconductor region and the fourth semiconductor region;
   a second electrode contacting the fifth semiconductor region;
   a sixth semiconductor region of the second conductivity type selectively provided in one of the first semiconductor region and the second semiconductor region, separate from the fifth semiconductor region, an impurity concentration of the sixth semiconductor region being higher than that of the second semiconductor region;
   a seventh semiconductor region of the first conductivity type selectively provided in the third semiconductor region, an impurity concentration of the seventh semiconductor region being higher than that of the third semiconductor region, wherein the first electrode is in contact with the seventh semiconductor region; and
   a third electrode contacting the sixth semiconductor region, wherein
   a first distance between the fourth semiconductor region and the fifth semiconductor region is a drift length of a first element,
   a second distance between the seventh semiconductor region and the sixth semiconductor region is a drift length of a second element different from the first element, and
   the first distance is longer than the second distance.

2. The semiconductor device according to claim 1, further comprising
   a twelfth semiconductor region of the second conductivity type on an outer side of the third semiconductor region.

3. The semiconductor device according to claim 1, wherein the first electrode is in direct contact with the seventh semiconductor region.

4. The semiconductor device according to claim 1, wherein
   the first element includes the fourth semiconductor region and the fifth semiconductor region, and
   the second element includes a p-n junction between the second semiconductor region and the third semiconductor region.

5. A semiconductor device, comprising:
   a first semiconductor region of a second conductivity type selectively provided on a semiconductor substrate of a first conductivity-type;
   a second semiconductor region of the second conductivity type surrounding a periphery of the first semiconductor region;
   a third semiconductor region of the first conductivity type surrounding a periphery-of the second semiconductor region;
   a fourth semiconductor region of the second conductivity type selectively provided in the third semiconductor region;
   a fifth semiconductor region of the second conductivity type selectively provided in one of the first semiconductor region and the second semiconductor region, an impurity concentration of the fifth semiconductor region being higher than that of the second semiconductor region;
   a first gate electrode provided on a surface of a portion of the third semiconductor region between the fourth semiconductor region and the second semiconductor region, the first gate electrode provided via a first gate insulating film;
   a first electrode contacting the third semiconductor region and the fourth semiconductor region;
   a second electrode contacting the fifth semiconductor region;
   a sixth semiconductor region of the second conductivity type selectively provided in one of the first semiconductor region and the second semiconductor region, separate from the fifth semiconductor region, an impurity concentration of the sixth semiconductor region being higher than that of the second semiconductor region;
   a seventh semiconductor region of the first conductivity type selectively provided in the third semiconductor region, an impurity concentration of the seventh semiconductor region being higher than that of the third semiconductor region, wherein the first electrode is in contact with the seventh semiconductor region;
   a third electrode contacting the sixth semiconductor region; and
   an eighth semiconductor region of the first conductivity type provided at least on an inner side of the fifth semiconductor region, wherein
   a distance between the fourth semiconductor region and the fifth semiconductor region is longer than a distance between the seventh semiconductor region and the sixth semiconductor region,
   the second semiconductor region is arranged to have a protruding part that protrudes either inwardly toward a center of the first semiconductor region or outwardly away from the center of the first semiconductor region in a planar layout, or that protrudes both inwardly and outwardly in the planar layout, the fifth semiconductor region is arranged in an inward portion of the protruding part of the second semiconductor region, and the fourth semiconductor region is arranged at a position facing an outer side of the fifth semiconductor region.

6. The semiconductor device according to claim 5, wherein the second semiconductor region is arranged in a planar layout in which the protruding part protrudes inwardly, toward the center of the first semiconductor region, and the fifth semiconductor region is arranged at an inwardly-protruding end portion of the protruding part of the second semiconductor region.

7. The semiconductor device according to claim 6, wherein a width, in a circumferential direction, of the inwardly-protruding end portion of the protruding part of the second semiconductor region increases in a direction from the center of the first semiconductor region toward an outer side of the semiconductor substrate.

8. The semiconductor device according to claim 5, wherein the second semiconductor region is arranged to have the protruding part protruding outwardly in a planar layout, toward an outer edge of the semiconductor substrate, and the fourth semiconductor region is arranged in the third semiconductor region at an outwardly-protruding end portion of the protruding part of the second semiconductor region.

9. The semiconductor device according to claim 8, wherein a width, in a circumferential direction, of the outwardly-protruding end portion of the protruding part of the second semiconductor region decreases in a direction from the center of the first semiconductor region toward an outer side of the semiconductor substrate.

10. The semiconductor device according to claim 5, wherein the second semiconductor region contacts the first semiconductor region at a portion of the second semiconductor region other than the protruding part.

11. The semiconductor device according to claim 5, further comprising a ninth semiconductor region of the first conductivity type selectively provided in the second semiconductor region;

a tenth semiconductor region of the first conductivity type selectively provided in one of the first semiconductor region and the second semiconductor region, separate from the ninth semiconductor region, and farther inward toward a center of the first semiconductor region than the ninth semiconductor region;

an eleventh semiconductor region of the first conductivity type selectively provided in an outward portion in the ninth semiconductor region, an impurity concentration of the eleventh semiconductor region being higher than that of the ninth semiconductor region;

a second gate electrode provided on a surface of a portion of the second semiconductor region between the ninth semiconductor region and the tenth semiconductor region, the second gate electrode provided via a second gate insulating film;

a fourth electrode contacting the tenth semiconductor region; and a fifth electrode contacting the eleventh semiconductor region, wherein the eleventh semiconductor region is arranged at a position facing an outer side of the tenth semiconductor region, and a distance between the tenth semiconductor region and the eleventh semiconductor region is longer than a distance between the seventh semiconductor region and the sixth semiconductor region.

12. The semiconductor device according to claim 11, wherein the second semiconductor region is arranged in a planar layout in which a first portion of the second semiconductor region contacts the first semiconductor region, and the first portion of the second semiconductor region protrudes inwardly toward a center of the first semiconductor region or outwardly away from the center of the first semiconductor region, or is arranged in a planar layout in which the first portion contacting the first semiconductor region protrudes both inwardly and outwardly.

13. A semiconductor device, comprising:

a first semiconductor region of a second conductivity type selectively provided on semiconductor substrate of a first conductivity type;

a second semiconductor region of a second conductivity type surrounding a periphery of the first semiconductor region, a portion of the second semiconductor region contacting the first semiconductor region;

a third semiconductor region of the first conductivity type surrounding a periphery of the second semiconductor region;

a sixth semiconductor region of the second conductivity type selectively provided in one of the first semiconductor region and the second semiconductor region, an impurity concentration of the sixth semiconductor being higher than that of the second semiconductor region;

a seventh semiconductor region of the first conductivity type selectively provided in the third semiconductor region, an impurity concentration of the seventh semiconductor region being higher than that of the third semiconductor region;

a first electrode contacting the seventh semiconductor region;

a third electrode contacting the sixth semiconductor region;

a ninth semiconductor region of the first conductivity type selectively provided in the second semiconductor region, separate from the sixth semiconductor region;

a tenth semiconductor region of the first conductivity type selectively provided in the second semiconductor region, separate from the ninth semiconductor region, and farther inward than the ninth semiconductor region;

an eleventh semiconductor region of the first conductivity type selectively provided in an outward portion in the ninth semiconductor region, an impurity concentration of the eleventh semiconductor region being higher than that of the ninth semiconductor region;

a second gate electrode provided on a surface of a portion of the second semiconductor region between the ninth semiconductor region and the tenth semiconductor region, the second gate electrode provided via a second gate insulating film;

a fourth electrode contacting the tenth semiconductor region; and a fifth electrode contacting the eleventh semiconductor region, wherein the eleventh semiconductor region is arranged at a position facing an outer side of the tenth semiconductor region, and a distance between the tenth semiconductor region and the eleventh semiconductor region is longer than a distance between the seventh semiconductor region and the sixth semiconductor region.

14. The semiconductor device according to claim 13, wherein the second semiconductor region is arranged in a planar layout in which the portion contacting the first semiconductor region protrudes inwardly toward a center of the first semiconductor region or outwardly away from the center of the first semiconductor region, or is arranged in a planar layout in which the portion contacting the first semiconductor region protrudes both inwardly and outwardly.

15. The semiconductor device according to claim 13, further comprising a twelfth semiconductor region of the second conductivity type on an outer side of the third semiconductor region.

* * * * *